(12) United States Patent
Noda et al.

(10) Patent No.: US 9,755,083 B2
(45) Date of Patent: Sep. 5, 2017

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Kosei Noda, Kanagawa (JP); Satoshi Toriumi, Kanagawa (JP); Kazuki Tanemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/245,268

(22) Filed: Aug. 24, 2016

(65) Prior Publication Data
US 2016/0365454 A1 Dec. 15, 2016

Related U.S. Application Data

(63) Continuation of application No. 14/252,348, filed on Apr. 14, 2014, now Pat. No. 9,450,102.

(30) Foreign Application Priority Data

Apr. 26, 2013 (JP) ................................. 2013-094550

(51) Int. Cl.
*H01L 29/06* (2006.01)
*H01L 29/786* (2006.01)
(Continued)

(52) U.S. Cl.
CPC ...... *H01L 29/7869* (2013.01); *H01L 29/0692* (2013.01); *H01L 29/4908* (2013.01);
(Continued)

(58) Field of Classification Search
CPC .......... H01L 29/66742; H01L 29/7869; H01L 29/4908; H01L 29/0692; H01L 29/66969; H01L 29/78606; H01L 29/78603
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Latanya N Crawford
(74) *Attorney, Agent, or Firm* — Fish & Richardson P.C.

(57) ABSTRACT

Electrical characteristics of a semiconductor device including the oxide semiconductor are improved. Furthermore, a highly reliable transistor with small variation in electrical characteristics is manufactured. An oxynitride insulating film functioning as a base insulating film and a transistor in contact with the oxynitride insulating film are provided. The transistor includes an oxide semiconductor film in contact with the oxynitride insulating film functioning as a base insulating film. The total amount of gas having a mass-to-charge ratio of 30 released from the oxynitride insulating film by heat treatment and double of the amount of a gas having a mass-to-charge ratio of 32 released from the oxynitride insulating film by heat treatment is greater than or
(Continued)

equal to $5\times10^{15}$/cm² and less than or equal to $5\times10^{16}$/cm², or greater than or equal to $5\times10^{15}$/cm² and less than or equal to $3\times10^{16}$/cm².

14 Claims, 16 Drawing Sheets

(51) Int. Cl.
    *H01L 29/66* (2006.01)
    *H01L 29/49* (2006.01)

(52) U.S. Cl.
    CPC .. *H01L 29/66969* (2013.01); *H01L 29/78603* (2013.01); *H01L 29/78606* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,557,641 | B2 | 10/2013 | Sasaki et al. |
| 8,728,860 | B2 | 5/2014 | Yamazaki |
| 8,797,788 | B2 | 8/2014 | Sekine |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0284844 | A1 | 11/2011 | Endo et al. |
| 2013/0020569 | A1 | 1/2013 | Yamazaki et al. |
| 2013/0228775 | A1 | 9/2013 | Noda et al. |
| 2014/0011320 | A1 | 1/2014 | Sasaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 06-275697 | A | 9/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2007-096055 | A | 4/2007 |
| JP | 2007-123861 | A | 5/2007 |
| JP | 2011-029630 | A | 2/2011 |
| JP | 2012-009836 | A | 1/2012 |
| WO | WO-2004/114391 | | 12/2004 |
| WO | WO-2011/001879 | | 1/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett.(Physical Review Letters), May 4, 1981, vol. 46, No. 18, pp. 1216-1219.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

SEMICONDUCTOR DEVICE AND METHOD FOR MANUFACTURING THE SAME

CROSS-REFERENCE TO RELATED APPLICATIONS

This application is a divisional of U.S. application Ser. No. 14/252,348, filed Apr. 14, 2014, now allowed, which claims the benefit of a foreign priority application filed in Japan as Serial No. 2013-094550 on Apr. 26, 2013, both of which are incorporated by reference.

BACKGROUND OF THE INVENTION

1. Field of the Invention

The present invention relates to a semiconductor device including a field-effect transistor and a method for manufacturing the semiconductor device.

2. Description of the Related Art

Transistors used for most flat panel displays typified by liquid crystal display devices and light-emitting display devices are formed using silicon semiconductors such as amorphous silicon, single crystal silicon, and polycrystalline silicon provided over glass substrates. Furthermore, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

Patent Document 3 discloses that the water content of an oxide semiconductor film is reduced by heat treatment, whereby water and hydrogen that are impurities in the oxide semiconductor film are reduced.

One of defects included in an oxide semiconductor film is oxygen vacancy. Oxygen vacancy in an oxide semiconductor film generates electrons serving as carriers. As a result, electrical characteristic variation, typically, a negative shift of the threshold voltage occurs in a transistor including the oxide semiconductor including oxygen vacancy. Further, when the oxide semiconductor film includes oxygen vacancy, as a problem, the amount of change in electrical characteristics, typically, the threshold voltage of the transistor is increased due to a change over time or a stress test (e.g., a bias-temperature stress test, which is also referred to as a BT stress test) and the reliability is reduced.

Thus, Patent Document 4 discloses that an insulating film from which oxygen is released by heating is formed as an insulating film in contact with an oxide semiconductor film by a sputtering method and subjected to heat treatment, whereby oxygen is supplied from the insulating film to the oxide semiconductor film and oxygen vacancy in the oxide semiconductor film is compensated.

REFERENCE

Patent Document

[Patent Document 1] Japanese Published Patent Application No. 2007-123861

[Patent Document 2] Japanese Published Patent Application No. 2007-096055

[Patent Document 3] Japanese Published Patent Application No. 2011-029630

[Patent Document 4] Japanese Published Patent Application No. 2012-009836

SUMMARY OF THE INVENTION

However, when a sputtering method is used, the cycle time is long and thickness distribution within a plane of a deposited film is varied, and particles are easily generated, which causes a reduction in the productivity and the yield. Coverage with an insulating film formed by a sputtering method is low in the case where a wiring and the like is formed below the insulating film and a surface over which the insulating film is formed is uneven; therefore, a short circuit of the wiring formed below the insulating film and a wiring which is to be formed over the insulating film easily occurs, which causes a reduction in the yield.

Therefore, the insulating film from which oxygen is released by heating is preferably formed by a chemical vapor deposition (CVD) method. However, a CVD method is a method in which a film is deposited utilizing chemical reaction of active species; therefore, the insulating film from which oxygen can be released by heating is not easily formed by a CVD method.

It is possible to mix unreacted oxygen into the film using a low-temperature CVD method, and as a result, an insulating film from which oxygen can be released by heating can be formed; however, many defects are included in the insulating film. Thus, a transistor in which the insulating film from which oxygen is released by oxygen is formed as the base insulating film by a low-temperature CVD method has a problem in that electrons flowing between the source electrode and the drain electrode are trapped by defects included in the base insulating film and thus on-state current of the transistor becomes small. In addition, the transistor has a problem in that electrons are trapped by defects included in the base insulating film at the time of a stress test, so that the amount of shift of the threshold voltage is increased and the reliability is reduced.

In view of this, an object of one embodiment of the present invention is to improve electrical characteristics of a semiconductor device including an oxide semiconductor. Another object of one embodiment of the present invention is to manufacture a highly reliable semiconductor device with small variation in electrical characteristics.

One embodiment of the present invention is an oxynitride insulating film functioning as a base insulating film and a transistor provided in contact with the oxynitride insulating film. The transistor includes an oxide semiconductor film in contact with the oxynitride insulating film functioning as a base insulating film. The total of the amount of a gas having a mass-to-charge ratio of 30 released from the oxynitride insulating film by heat treatment and double of the amount of a gas having a mass-to-charge ratio of 32 released from the oxynitride insulating film by heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$.

Another embodiment of the present invention is an oxynitride insulating film functioning as a base insulating film and a transistor provided in contact with the oxynitride insulating film. The transistor includes an oxide semiconductor film in contact with the oxynitride insulating film functioning as a base insulating film. The total of the amount of a gas having a mass-to-charge ratio of 30 released from the oxynitride insulating film by heat treatment and double of the amount of a gas having a mass-to-charge ratio of 32 released from the oxynitride insulating film by heat treatment is greater than or equal to $1 \times 10^{20}/cm^3$ and less than or equal to $1 \times 10^{21}/cm^3$, or greater than or equal to $1 \times 10^{20}/cm^3$ and less than or equal to $5 \times 10^{20}/cm^3$.

Note that a typical example of the gas having a mass-to-charge ratio of 30 is nitrogen monoxide, and a typical example of the gas having a mass-to-charge ratio of 32 is oxygen. Further, the total of the amount of the released gas having a mass-to-charge ratio of 30 and double of the amount of the released gas having a mass-to-charge ratio of 32 corresponds to the amount of released oxygen atoms derived from oxygen molecules and nitrogen monoxide.

When dinitrogen monoxide or nitrogen dioxide is used as an oxidizing gas contained in a source gas used in a CVD method, a film to be deposited contains oxygen and nitrogen. Furthermore, a gas having a mass-to-charge ratio of 30, typically, nitrogen monoxide is released by heating. In a transistor including an oxide semiconductor film, when an oxynitride insulating film which contains oxygen at a higher proportion than oxygen in the stoichiometric composition is provided as the oxynitride insulating film in contact with the oxide semiconductor film, oxygen is supplied from the oxynitride insulating film to the oxide semiconductor film, so that interface states between the oxynitride insulating film and the oxide semiconductor film can be reduced and oxygen vacancy included in the oxide semiconductor film can be reduced. As a result, electric charge or the like which may be generated due to an operation of the transistor or the like can be prevented from being trapped at the interface between the oxynitride insulating film and the oxide semiconductor film; accordingly, a transistor with high on-state current and small variation in electric characteristics can be provided.

In one embodiment of the present invention, a transistor is manufactured in such a manner that an oxynitride insulating film which contains oxygen at a higher proportion than oxygen in the stoichiometric composition and serves as a base insulating film is formed over a substrate by a CVD method using an oxidizing gas and a deposition gas containing silicon, and an oxide semiconductor film is provided over the base insulating film.

The base insulating film is formed over the substrate by a CVD method under conditions where a source gas whose flow rate ratio of the oxidizing gas to the deposition gas containing silicon is higher than 50 and lower than or equal to 10000, or higher than or equal to 200 and lower than or equal to 1500 is introduced to a treatment chamber, and the pressure in the treatment chamber is higher than or equal to 100 Pa and lower than or equal to 1500 Pa, or higher than or equal to 200 Pa and lower than or equal to 1000 Pa, and a high-frequency power is supplied to an electrode provided in the treatment chamber.

Note that the substrate is preferably kept at a temperature higher than or equal to 200° C. and lower than 450° C. Silane, disilane, trisilane, silane fluoride, and the like can be given as typical examples of the deposition gas containing silicon, dinitrogen monoxide, nitrogen dioxide, and the like can be given as examples of the oxidizing gas. Further, it is preferable that a high-frequency power of higher than or equal to 0.2 W/cm² and lower than or equal to 5.0 W/cm², or higher than or equal to 1.8 W/cm² and lower than or equal to 3.7 W/cm² be supplied to an electrode provided in a treatment chamber.

The supply of the high-frequency power having the power density to the treatment chamber at the pressure increases decomposition efficiency of the source gas in plasma. When a nitrogen oxide such as dinitrogen monoxide or nitrogen dioxide is used as the oxidizing gas, oxidation reaction of the deposition gas containing silicon is promoted. Furthermore, a high flow rate ratio of the oxidizing gas to the deposition gas containing silicon increases oxygen radicals to promote oxidation of the source gas. As a result, the oxygen content of the base insulating film can be higher than that in the stoichiometric composition. In addition, when the substrate temperature is set within the above range, the water content of the base insulating film can be reduced.

An oxynitride insulating film which contains oxygen at a higher proportion than oxygen in the stoichiometric composition is formed as a base insulating film, and a transistor including an oxide semiconductor film is formed over the base insulating film, whereby on-state current of the transistor can be increased and electrical characteristics of the semiconductor device can be increased. Further, electrical characteristics variation of the semiconductor device due to change over time or a stress test can be reduced to improve reliability.

DETAILED DESCRIPTION OF THE INVENTION

Figure 1A:
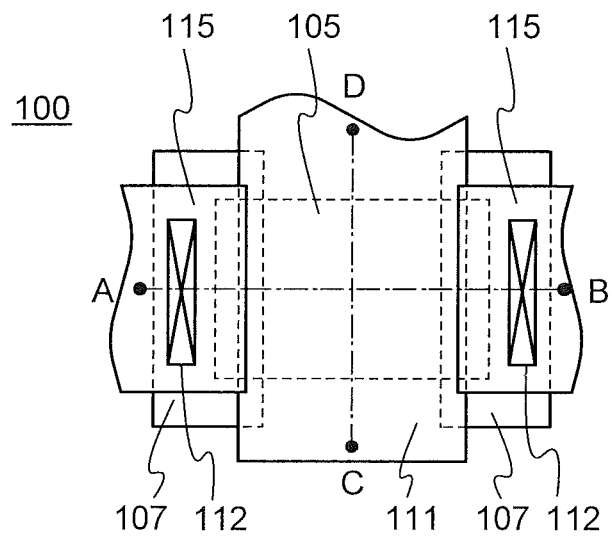
FIGS. 1A to 1C are a top view and cross-sectional views illustrating one embodiment of a transistor.

Embodiments of the present invention will be described below in detail with reference to the drawings. Note that the present invention is not limited to the following description. Note that the present invention is not limited to the following description, and it is easily understood by those skilled in the art that the mode and details can be variously changed without departing from the spirit and scope of the present invention. Therefore, the present invention should not be construed as being limited to the following description of the embodiments. In addition, in the following embodiments and example, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such a scale.

In addition, terms such as "first", "second", and "third" in this specification are used in order to avoid confusion among components, and the terms do not limit the components numerically. Therefore, for example, description can be made even when "first" is replaced with "second" or "third", as appropriate.

Note that, functions of "source" and "drain" may become switched in the case that a direction of a current flow is changed during circuit operation, for example. Therefore, the terms "source" and "drain" can be used to denote the drain and the source, respectively, in this specification.

Embodiment 1

In this embodiment, a method for manufacturing a semiconductor device of one embodiment of the present invention, and a semiconductor device manufactured in accordance with the method are described with reference to drawings.

<Structure of Semiconductor Device>

Figure 1C:
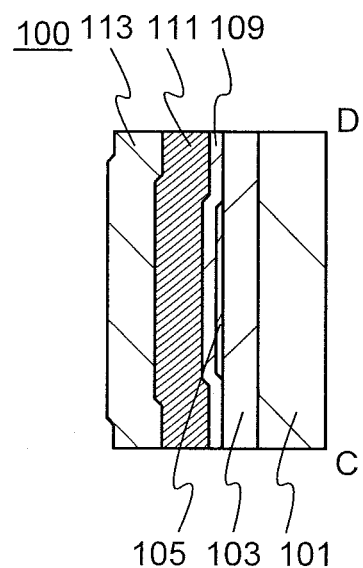
Figure 1B:
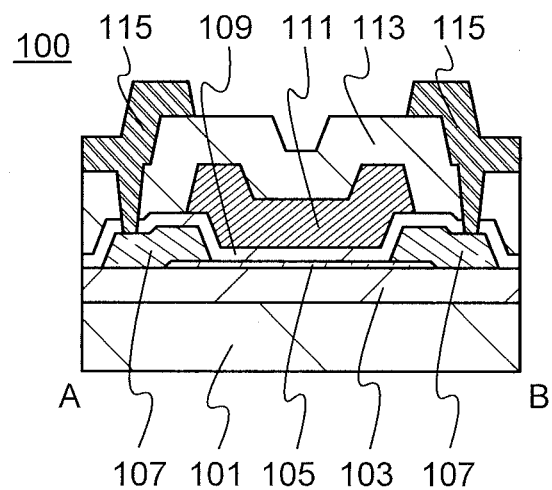

FIGS. 1A to 1C are a top vies and cross-sectional views of a transistor 100. FIG. 1A is a top view of the transistor 100, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 101, a base insulating film 103, a gate insulating film 109, an insulating film 113, and the like are not illustrated for simplicity.

The transistor 100 illustrated in FIGS. 1A to 1C includes an oxide semiconductor film 105 over a base insulating film 103 over a substrate 101, a pair of electrodes 107 in contact with the oxide semiconductor film 105, a gate insulating film 109 in contact with the base insulating film 103, the oxide semiconductor film 105, and the pair of electrodes 107, and a gate electrode 111 overlapping the oxide semiconductor film 105 with the gate insulating film 109 positioned therebetween. In addition, the insulating film 113 covering the gate insulating film 109 and the gate electrode 111 is provided. Wirings 115 in contact with the pair of electrodes 107 in openings 112 of the gate insulating film 109 and the insulating film 113 may be provided.

In the transistor 100 in this embodiment, the pair of electrodes 107 and the gate electrode 111 overlap each other with the gate insulating film 109 positioned therebetween. Thus, a region of the oxide semiconductor film 105 which faces the gate electrode 111 with the gate insulating film 109 positioned therebetween functions as a channel region, and regions of the oxide semiconductor film 105 which are in contact with the pair of electrodes 107 function as low-resistance regions. That is, the channel region is in contact with the low-resistance regions. There is no region serving as resistance between the channel formation region and the low-resistance regions; therefore, on-state current and field-effect mobility can be increased.

As the base insulating film 103 in the transistor 100 described in this embodiment, an oxynitride insulating film which contains oxygen at a higher proportion than oxygen in the stoichiometric composition is used. Part of oxygen of the oxynitride insulating film containing oxygen at a higher proportion than oxygen in the stoichiometric composition is released by heating and thus the oxygen can be moved to the oxide semiconductor film.

In the oxynitride insulating film which contains oxygen at a higher proportion than oxygen in the stoichiometric composition, typically, the total of the amount of a gas having a mass-to-charge ratio of 30 released by the heat treatment and double of the amount of a gas having a mass-to-charge ratio of 32 released by the heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$. Alternatively, the total of the amount of the gas having a mass-to-charge ratio of 30 released by the heat treatment and double of the amount of the gas having a mass-to-charge ratio of 32 released by the heat treatment is greater than or equal to $1\times10^{20}/cm^3$ and less than or equal to $1\times10^{21}/cm^3$, or greater than or equal to $1\times10^{20}/cm^3$ and less than or equal to $5\times10^{20}/cm^3$.

Note that a typical example of the gas having a mass-to-charge ratio of 30 is nitrogen monoxide, and a typical example of the gas having a mass-to-charge ratio of 32 is oxygen. That is, the amount of released oxygen atoms derived from oxygen molecules and nitrogen monoxide which are released by the heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$. Alternatively, the amount of released oxygen atoms derived from oxygen molecules and nitrogen monoxide released by the heat treatment is greater than or equal to $1\times10^{20}/cm^3$ and less than or equal to $1\times10^{21}/cm^3$, or greater than or equal to $1\times10^{20}/cm^3$ and less than or equal to $5\times10^{20}/cm^3$.

A typical example of the base insulating film 103 is a silicon oxynitride film. Note that in this specification, a "silicon oxynitride film" refers to a film that contains oxygen at a higher proportion than nitrogen, and a "silicon nitride oxide film" refers to a film that contains nitrogen at a higher proportion than oxygen.

The thickness of the base insulating film 103 is greater than or equal to 50 nm, greater than or equal to 100 nm and less than or equal to 3000 nm, or greater than or equal to 200 nm and less than or equal to 1000 nm. With use of the thick base insulating film 103, the amount of oxygen released from the base insulating film 103 can be increased, and the interface state density at the interface between the base insulating film 103 and an oxide semiconductor film formed later and oxygen vacancy included in the oxide semiconductor film can be reduced.

As an example of a method for measuring the amount of a gas released by heat treatment, thermal desorption spectroscopy (TDS) is given. Here, a method in which the amount of released oxygen is measured by being converted into oxygen atoms using TDS analysis is described.

The amount of a released gas in TDS analysis is proportional to the integral value of a spectrum obtained by the analysis. Therefore, the amount of a released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the amount of oxygen molecules ($N_{O2}$) released from an insulating film can be found according to Formula 1 with the TDS analysis results of a silicon wafer containing hydrogen at a predetermined density which is the standard sample and the TDS analysis results of the insulating film. Here, all spectra having a mass-to-charge ratio of 32 which are obtained by the TDS analysis are assumed to originate from an oxygen molecule. Note that $CH_3OH$, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha \qquad \text{(Formula 1)}$$

$N_{H2}$ is the value obtained by conversion of the amount of hydrogen molecules released from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. To explain, for example, oxygen molecules, some of oxygen molecules released from the sample in TDS analysis are dissociated during the analysis to be detected as oxygen atoms having a mass number of 16. The ratio of the amount of released oxygen atoms detected owing to the dissociation of oxygen molecules to the amount of released and detected oxygen molecules is substantially constant. The ratio is referred to as a pattern coefficient. For example, when the pattern coefficient of oxygen molecules is 100, the pattern coefficient of oxygen atoms is 11.4. Furthermore, the ratio of oxygen molecules released in analysis to the oxygen molecules and oxygen atoms released in the analysis is referred to as a fragmentation coefficient. For example, the fragmentation coefficient of oxygen molecules is 0.898. The $\alpha$ in Formula 1 includes a reciprocal number of a fragmentation coefficient. That is, the amount of released molecules obtained from Formula 1 includes the amount of released oxygen molecules and released oxygen molecules dissociated to oxygen atoms. Note that for details of Formula 1, Japanese Published Patent Application No. H6-275697 is referred to. The amount of oxygen released from the above insulating film is measured with a thermal desorption spectroscopy apparatus produced by ESCO Ltd., EMD-WA1000S/W using a silicon wafer containing hydrogen atoms at $9.62 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. In the insulating film, the amount of released oxygen when converted into oxygen atoms is twice the amount of the released oxygen molecules.

Further, in Formula 1, an integral value of spectrum when the amount of nitrogen monoxide released from an insulating film is measured by the TDS analysis is substituted into Sot, whereby the amount of released nitrogen monoxide can be obtained.

Supply of oxygen from the base insulating film 103 and the oxide semiconductor film 105 can reduce the amount of oxygen vacancy included in the oxide semiconductor film 105. If oxygen vacancy is included in the oxide semiconductor film, electrons serving as carriers are generated owing to the oxygen vacancy, which reduces the resistance of the oxide semiconductor film; therefore, the threshold voltage of the transistor is shifted in the negative direction. However, since oxygen vacancy is reduced in the oxide semiconductor film included in the transistor described in this embodiment, the shift of the threshold voltage of the transistor can be reduced. Further, interface states between the base insulating film 103 and the oxide semiconductor film 105 can be reduced, and thus electric charge or the like which may be generated due to an operation of the transistor or the like can be prevented from being trapped at the interface between the base insulating film 103 and the oxide semiconductor film 105; accordingly, a transistor with high on-state current and small variation in electrical characteristics can be provided.

Other details of the transistor 100 are described below.

There is no particular limitation on a material and the like of the substrate 101 as long as the material has heat resistance high enough to withstand at least heat treatment performed later. For example, a glass substrate, a ceramic substrate, a quartz substrate, a sapphire substrate, or the like may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates further provided with a semiconductor element may be used as the substrate 101.

Still alternatively, a flexible substrate may be used as the substrate 101, and the base insulating film 103 and the transistor 100 may be provided directly on the flexible substrate. Alternatively, a separation layer may be provided between the substrate 101 and the base insulating film 103. The separation layer can be used when part or the whole of a semiconductor device formed over the separation layer is separated from the substrate 101 and transferred onto another substrate. In such a case, the transistor 100 can be transferred to a substrate having low heat resistance or a flexible substrate as well.

The oxide semiconductor film 105 is typically an In—Ga oxide film, an In—Zn oxide film, or an In-M-Zn oxide film (M is Ga, Y, Zr, La, Cs, or Nd). Furthermore, the oxide semiconductor film 105 is formed using a homologous compound represented by $InMO_3(ZnO)_m$ (M is Ga, Y, Zr, La, Cs, or Nd, and m is a natural number).

In the case where the oxide semiconductor film 105 is an In-M-Zn oxide film (M is Ga, Y, Zr, La, Cr, or Nd) and a target having the atomic ratio of metal elements of In:M:Zn=$x_1$:$y_1$:$z_1$ is used for forming the In-M-Zn oxide film, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 105 is easily formed. Typical examples of the atomic ratio of the metal elements of the target are In:M2:Zn=1:1:1, 1:1:1.2, or the like. Note that the proportion of each metal element in the atomic ratio of the oxide semiconductor film 105 formed using the above-described target varies within a range of ±40% as an error.

Note that in the case where the oxide semiconductor film 105 is an In-M-Zn oxide film, the proportions of In and M when summation of In and M is assumed to be 100 atomic % are preferably as follows: the atomic percentage of In is greater than or equal to 25 atomic % and the atomic percentage of M is less than 75 atomic %, or the atomic percentage of In is greater than or equal to 34 atomic % and the atomic percentage of M is less than 66 atomic %.

The energy gap of the oxide semiconductor film 105 is 2 eV or more, 2.5 eV or more, or 3 eV or more. In this manner, off-state current of a transistor can be reduced by using an oxide semiconductor having an energy gap.

The thickness of the oxide semiconductor film 105 is greater than or equal to 3 nm and less than or equal to 200 nm, greater than or equal to 3 nm and less than or equal to 100 nm, or greater than or equal to 3 nm and less than or equal to 50 nm.

Note that it is preferable to use, as the oxide semiconductor film 105, an oxide semiconductor film having a low impurity concentration and low density of defect states, in which case the transistor can have more excellent electrical characteristics. Here, the state in which impurity concentration is low and density of defect states is low (the amount of oxygen vacancy is small) is referred to as "highly purified intrinsic" or "substantially highly purified intrinsic".

A highly purified intrinsic or substantially highly purified intrinsic oxide semiconductor has few carrier generation sources, and thus has a low carrier density in some cases. Thus, in some cases, a transistor including the oxide semiconductor film in which a channel region is formed rarely has a negative threshold voltage (is rarely normally-on).

A highly purified intrinsic or substantially highly purified intrinsic oxide semiconductor film has a low density of defect states and accordingly has few carrier traps in some cases.

Further, the highly purified intrinsic or substantially highly purified intrinsic oxide semiconductor film has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Thus, the transistor in which the channel region is formed in the oxide semiconductor film has a small variation in electrical characteristics and high reliability. Charges trapped by the trap states in the oxide semiconductor film take a long time to be released and may behave like fixed charges. Thus, the transistor in which the channel region is formed in the oxide semiconductor film having a high density of trap states has unstable electrical characteristics in some cases. As examples of the impurities, hydrogen, nitrogen, alkali metal, alkaline earth metal, and the like are given.

A transistor in which an oxide semiconductor film having a structure similar to that of a CAAC-OS film described later is used as the oxide semiconductor film 105 has a small variation in electrical characteristics caused by irradiation with visible light or ultraviolet light Hydrogen contained in the oxide semiconductor film reacts with oxygen bonded to a metal atom to be water, and in addition, oxygen vacancy is formed in a lattice from which oxygen is released (or a portion from which oxygen is released). Due to entry of hydrogen into the oxygen vacancy, an electron serving as a carrier is generated. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor film 105. Specifically, the hydrogen concentration of the oxide semiconductor film 105, which is measured by secondary ion mass spectrometry (SIMS), is lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

When silicon or carbon which is one of elements belonging to Group 14 is contained in the oxide semiconductor film 105, the amount of oxygen vacancy is increased, and the oxide semiconductor film 105 is changed to an n-type. Thus, the concentration of silicon or carbon (the concentration is measured by SIMS) in the oxide semiconductor film 105 or the concentration of silicon or carbon (the concentration is measured by SIMS) in the vicinity of the interface between the base insulating film 103 and the oxide semiconductor film 105 is set to lower than or equal to $2\times10^{18}$ atoms/cm$^3$, or lower than or equal to $2\times10^{17}$ atoms/cm$^3$.

Further, the concentration of alkali metal or alkaline earth metal of the oxide semiconductor film 105, which is measured by SIMS, is lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 105.

Further, when containing nitrogen, the oxide semiconductor film 105 easily has an n-type region by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

Note that the oxide semiconductor film 105 may have a non-single crystal structure. The non-single crystal structure includes, for example, a CAAC-OS described later, a polycrystalline structure, a microcrystalline structure described later, and an amorphous structure. Among the non-single crystal structure, the amorphous structure has the highest density of defect states, whereas CAAC-OS described later has the lowest density of defect states.

Note that the oxide semiconductor film 105 may be a mixed film including two or more of the following: a region having an amorphous structure, a region having a microcrystalline structure, a region having a polycrystalline structure, a region of CAAC-OS described later, and a region having a single-crystal structure. The mixed film has a single-layer structure including, for example, two or more of a region having an amorphous structure, a region having a microcrystalline structure, a region having a polycrystalline structure, a region of CAAC-OS described later, and a region having a single-crystal structure in some cases. Further, the mixed film has a stacked-layer structure including, for example, two or more of a region having an amorphous structure, a region having a microcrystalline structure, a region having a polycrystalline structure, a region of CAAC-OS described later, and a region having a single-crystal structure in some cases.

The pair of electrodes 107 can be formed to have a single-layer structure or a stacked-layer structure using, as a conductive material, any of metals such as aluminum, titanium, chromium, nickel, copper, yttrium, zirconium, molybdenum, silver, ruthenium, tantalum, and tungsten, or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

It is preferable that end portions of the pair of electrodes 107 have a tapered shape or a step-like shape because coverage with the gate insulating film 109 is increased.

As the gate insulating film 109, for example, a silicon oxide film, a silicon oxynitride film, or the like having a thickness greater than or equal to 5 nm and less than or equal to 400 nm, greater than or equal to 10 nm and less than or equal to 300 nm, or greater than or equal to 20 nm and less than or equal to 100 nm can be used.

Note that in a manner similar to that of the base insulating film 103, the gate insulating film 109 may be formed using an oxynitride insulating film which contains oxygen at a higher proportion than oxygen in the stoichiometric composition. When an oxynitride insulating film which contains oxygen at a higher proportion than oxygen in the stoichiometric composition is used as the gate insulating film 109, oxygen is supplied from the gate insulating film 109 to the oxide semiconductor film 105 in the heat treatment, and therefore interface states between the gate insulating film 109 and the oxide semiconductor film 105 can be reduced. Furthermore, the amount of oxygen vacancy in the oxide semiconductor film 105 can be reduced. The oxynitride insulating film which contains oxygen at a higher proportion than oxygen in the stoichiometric composition and whose water content is reduced contains a small amount of water that serves as a supply source of hydrogen; therefore, generation of carriers in the oxide semiconductor film 105 caused by movement of water from the gate insulating film 109 to the oxide semiconductor film 105 can be inhibited. Accordingly, electrical characteristic variation of the transistor can be reduced.

The gate electrode 111 can be formed using a metal element selected from aluminum, chromium, copper, tantalum, titanium, molybdenum, ruthenium, and tungsten; an alloy containing any of these metal elements as a component; an alloy containing any of these metal elements in combination; or the like. Further, one or more metal elements selected from manganese and zirconium may be used. Further, the gate electrode 111 may have a single-layer structure or a stacked-layer structure including two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 111 can also be formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added. It is also possible to have a stacked-layer structure formed using the above light-transmitting conductive material and the above metal element.

The insulating film 113 is formed with a single-layer structure or a stacked-layer structure using one or more of a silicon oxide film, a silicon oxynitride film, a silicon nitride oxide film, a silicon nitride film, an aluminum oxide film, an aluminum oxynitride film, an aluminum nitride oxide film, an aluminum nitride, and the like to a thickness greater than or equal to 30 nm and less than or equal to 500 nm, or greater than or equal to 100 nm and less than or equal to 400 nm.

The insulating film 113 may have a stacked-layer structure including an oxynitride insulating film which contains oxygen at a higher proportion than oxygen in the stoichiometric composition in a manner similar to that of the base insulating film 103, and an insulating film having a blocking effect against hydrogen, water, and the like. Examples of the insulating film having a blocking effect against oxygen, hydrogen, water, and the like are films of aluminum oxide, aluminum oxynitride, gallium oxide, gallium oxynitride, yttrium oxide, yttrium oxynitride, hafnium oxide, hafnium oxynitride, silicon nitride, and the like. Such a structure can reduce interface states between the oxide semiconductor film 105 and the base insulating film 103 and/or the gate insulating film 109 because oxygen is supplied to the oxide semiconductor film 105 through the gate insulating film 109 and/or the base insulating film 103 in the heat treatment. Further more, the amount of oxygen vacancy in the oxide semiconductor film 105 can be reduced.

The wirings 115 can be formed using a material which can be used for the pair of electrodes 107 as appropriate.

<Modification Example 1 of Semiconductor Device>

Here, a transistor including an oxide semiconductor film and a pair of electrodes which are different from those of the transistor in FIGS. 1A to 1C is described. Although the pair of electrodes 107 is provided between the oxide semiconductor film 105 and the gate insulating film 109 in the transistor illustrated in FIG. 1B, the pair of electrodes may be provided between the base insulating film 103 and the oxide semiconductor film 105. In this case, to increase step coverage with the oxide semiconductor film 105, the thickness of the pair of electrodes is preferably small.

In forming the transistor having the structure, after the pair of electrodes is formed, the oxide semiconductor film 105 and the gate insulating film 109 are formed. Thus, the oxide semiconductor film 105 is not exposed to an etching gas, and the gate insulating film 109 is formed over the oxide semiconductor film 105; therefore, etching damage to the oxide semiconductor film 105 can be eliminated and the electrical characteristics of the transistor can be improved.

<Method for Manufacturing Semiconductor Device>

Next, a method for manufacturing the transistor in FIG. 1B is described with reference to FIGS. 2A to 2D.

Figure 2A:
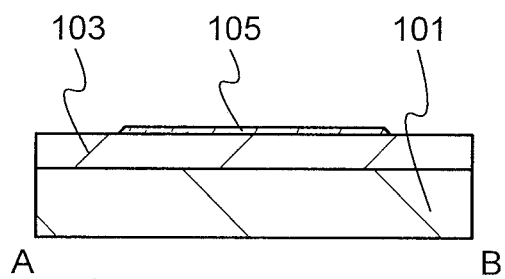
FIGS. 2A to 2D are cross-sectional views illustrating one embodiment of a method for manufacturing a transistor.

As illustrated in FIG. 2A, the base insulating film 103 is formed over the substrate 101. Next, the oxide semiconductor film 105 is formed over the base insulating film 103.

In the case where the base insulating film 103 is formed using a silicon oxynitride film, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

Typical deposition conditions of the base insulating film 103 are as follows. A silicon oxynitride film is formed under conditions where a source gas with a flow rate ratio of an oxidizing gas to a deposition gas containing silicon of greater than 50 and less than or equal to 10000 or greater than or equal to 200 and less than or equal to 1500 is introduced to an evacuated treatment chamber of a plasma CVD apparatus, the pressure in the treatment chamber is set higher than or equal to 100 Pa and lower than or equal to 1500 Pa, or higher than or equal to 200 Pa and lower than or equal to 1000 Pa, and high-frequency power is supplied to an electrode provided in the treatment chamber. Note that the temperature of the substrate over the electrode provided in the treatment chamber is preferably higher than or equal to 200° C. and lower than 450° C., or higher than or equal to 200° C. and lower than or equal to 350° C. Further, it is preferable that a high-frequency power of higher than or equal to 0.2 W/cm$^2$ and lower than or equal to 5.0 W/cm$^2$, or higher than or equal to 1.8 W/cm$^2$ and lower than or equal to 3.7 W/cm$^2$ be supplied to the electrode provided in the treatment chamber. In the case where the electrode in the treatment chamber is parallel plate type, the power is supplied to the electrode facing the substrate. Alternatively, the power may be supplied to the electrode over which the substrate is set.

In the deposition conditions of the base insulating film 103, when the high-frequency power with the above power density is supplied to the treatment chamber at the above pressure, decomposition efficiency of the source gas is increased in plasma. In addition, when the flow rate ratio of the oxidizing gas to the deposition gas containing silicon is set high, oxygen radicals are increased and oxidization of the source gas proceeds; therefore, the oxygen content in the base insulating film 103 is higher than that in the stoichiometric composition. When a nitrogen oxide such as dinitrogen monoxide or nitrogen dioxide is used as the oxidizing gas, oxidation reaction of the deposition gas containing silicon is promoted, so that the oxygen content in the base insulating film 103 is further higher than that in the stoichiometric composition, as compared to the case where oxygen is used as the oxidizing gas. Note that when oxygen is used as the oxidizing gas, a particle is generated and the yield is decreased; however, when nitrogen oxide such as dinitrogen monoxide and nitrogen dioxide is used as the oxidizing gas, generation of a particle can be suppressed. Further, when nitrogen oxide such as dinitrogen monoxide and nitrogen dioxide is used as the oxidizing gas, the base insulating film 103 is an oxynitride insulating film that is an oxide insulating film containing nitrogen. Further, the nitrogen becomes nitrogen monoxide to be released by heat treatment. Therefore, detection of NO in TDS analysis indicates that dinitrogen monoxide or nitrogen dioxide is used as the oxidizing gas. Further, when the substrate temperature falls within the above range, the water content of the base insulating film 103 can be reduced. As a result, an oxynitride insulating film containing oxygen containing oxygen at a higher proportion than oxygen in the stoichiometric composition can be formed as the base insulating film 103.

Note that since the base insulating film 103 formed in this embodiment contains oxygen at a higher proportion than oxygen in the stoichiometric composition, a step of adding oxygen is not particularly needed in addition to the step of forming the insulating film. That is, according to this embodiment, the base insulating film which is capable of reducing defects in the oxide semiconductor film 105, defects at the interface with the oxide semiconductor film 105, and oxygen vacancy included in the oxide semiconductor film can be formed by a small number of steps.

Here, a 300-nm-thick silicon oxynitride film is formed as the base insulating film 103 under the conditions where silane at a flow rate of 2 sccm and dinitrogen monoxide at a flow rate of 4000 sccm are supplied as a source gas to the treatment chamber, the pressure of the treatment chamber is controlled to 700 Pa, and a power of 250 W is supplied to one of the parallel plate electrodes with a high-frequency power source of 60 MHz.

The oxide semiconductor film 105 can be formed by a sputtering method, a coating method, a pulsed laser deposition method, a laser ablation method, or the like.

In the case where the oxide semiconductor film 105 is formed by a sputtering method, a power supply device for generating plasma can be an RF power supply device, an AC power supply device, a DC power supply device, or the like as appropriate.

As a sputtering gas, a rare gas (typically argon) atmosphere, an oxygen gas atmosphere, or a mixed gas of a rare gas and oxygen is used as appropriate. In the case of using the mixed gas of a rare gas and oxygen, the proportion of oxygen to a rare gas is preferably increased.

Further, a target may be appropriately selected in accordance with the composition of the oxide semiconductor film 105 to be formed.

Alternatively, by using a printing method for forming the oxide semiconductor film 105, the oxide semiconductor film 105 that is subjected to element isolation can be formed directly.

Here, a 15-nm-thick oxide semiconductor film is formed by a sputtering method using a target having an atomic ratio of In:Ga:Zn=1:1:1 and then a mask is formed over the oxide semiconductor film; part of the oxide semiconductor film is selectively etched to form the oxide semiconductor film 105.

Next, first heat treatment is preferably performed. By this heat treatment, part of oxygen contained in the base insulating film 103 can be transferred to the vicinity of the interface between the base insulating film 103 and the oxide semiconductor film 105 and to the oxide semiconductor film 105. As a result, the interface states in the vicinity of the interface between the base insulating film 103 and the oxide semiconductor film 105 can be reduced and oxygen vacancy included in the oxide semiconductor film can be reduced. Note that in the case where oxygen can be moved from the base insulating film 103 to the oxide semiconductor film 105 in such a manner that the oxide semiconductor film 105 is provided over the base insulating film 103 while being heated, the heat treatment can be omitted. Further, the heat treatment also serves as later heat treatment, whereby the number of manufacturing steps can be reduced.

The first heat treatment is performed typically at a temperature higher than or equal to 150° C. and lower than the strain point of the substrate, higher than or equal to 250° C.

and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

Here, heat treatment is performed in an atmosphere containing nitrogen at 450° C. for one hour, and then heat treatment is performed in an atmosphere of nitrogen and oxygen at 450° C. for one hour.

Note that the heat treatment may be performed in a later step, not this step. In other words, in another heating step performed later, part of oxygen in the base insulating film 103 may be transferred to the oxide semiconductor film 105. In this case, the number of heating steps can be reduced.

Figure 2B:
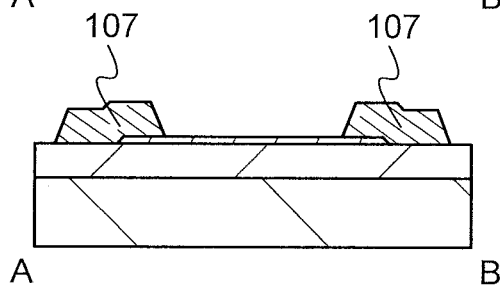

Next, as illustrated in FIG. 2B, the pair of electrodes 107 is formed.

A formation method of the pair of electrodes 107 is described below. First, a conductive film to be the pair of electrodes 107 is formed by a sputtering method, a CVD method, an evaporation method, or the like. Then, a mask is formed over the conductive film to be the pair of electrodes 107 by a photolithography process. Next, the conductive film to be the pair of electrodes 107 is etched with the use of the mask to form the pair of electrodes 107. After that, the mask is removed.

Here, a 100-nm-thick tungsten film is stacked by a sputtering method. Then, a mask is formed over the tungsten film by a photolithography process and the tungsten film is dry-etched with use of the mask to form the pair of electrodes 107.

After the pair of electrodes 107 is formed, cleaning treatment is preferably performed to remove an etching residue. A short circuit of the pair of electrodes 107 can be inhibited by this cleaning treatment. The cleaning treatment can be performed using an alkaline solution such as a tetramethylammonium hydroxide (TMAH) solution, an acidic solution such as diluted hydrofluoric acid, an oxalic acid solution, or a phosphoric acid solution.

Note that the pair of electrodes 107 may be formed by a printing method or an inkjet method.

Figure 2C:
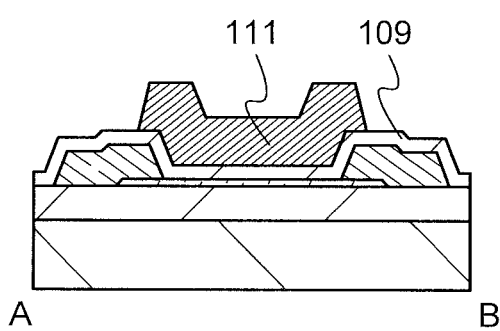

The gate insulating film 109 is formed, and then, the gate electrode 111 is formed over the gate insulating film 109 as illustrated in FIG. 2C.

The gate insulating film 109 is formed by a CVD method, an evaporation method, or the like.

In the case of forming the gate insulating film 109 using a silicon oxide film or a silicon oxynitride film, a deposition gas containing silicon and an oxidizing gas are preferably used as a source gas.

In the case where a gallium oxide film is formed as the gate insulating film 109, metal organic chemical vapor deposition (MOCVD) can be used.

In addition, after an oxide insulating film is formed as the gate insulating film 109 by a CVD method, the oxide insulating film is exposed to oxygen plasma, whereby defects of the oxide insulating film can be reduced and the density thereof can be increased. Note that the oxygen plasma can be generated utilizing an electric-field energy of high-frequency waves or microwaves. The use of the oxide insulating film subjected to oxygen plasma as the gate insulating film 109 can reduce leakage current of the transistor.

Here, the gate insulating film 109 is formed using a 20-nm-thick silicon oxynitride film by a plasma CVD method.

A formation method of the gate electrode 111 is described below. First, a conductive film to be the gate electrode 111 is formed by a sputtering method, a CVD method, an evaporation method, or the like, and a mask is formed over the conductive film to be the gate electrode 111 through a photolithography process. Next, part of the conductive film to be the gate electrode 111 is etched with the use of the mask to form the gate electrode 111. After that, the mask is removed.

Note that the gate electrode 111 may be formed by an electrolytic plating method, a printing method, an inkjet method, or the like, instead of the above formation method.

In this embodiment, a 30-nm-thick titanium nitride film and a 135-nm-thick tungsten film are faulted in this order by a sputtering method. Next, a mask is formed by a photolithography process, and the titanium nitride film and the tungsten film are subjected to dry etching with the use of the mask to form the gate electrode 111.

Figure 2D:
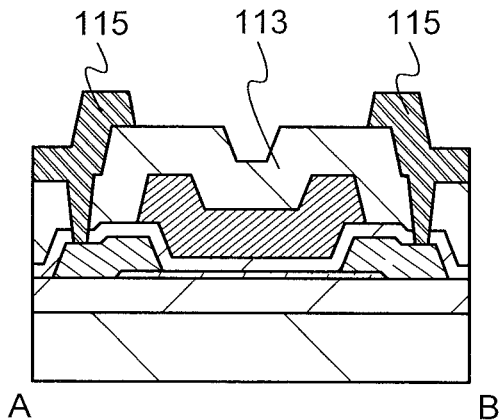

Next, the insulating film 113 is formed over the gate insulating film 109 and the gate electrode 111, and then the wirings 115 connected to the pair of electrodes 107 are formed as illustrated in FIG. 2D.

An insulating film to be the insulating film 113 is formed, second heat treatment is performed, and then openings are formed in the insulating film, whereby the insulating film 113 is formed. The insulating film to be the insulating film 113 is formed by a CVD method or a sputtering method. As the insulating film to be the insulating film 113, an oxynitride insulating film which contains oxygen at a higher proportion than oxygen in the stoichiometric composition may be formed under conditions similar to those of the base insulating film 103.

In this embodiment, a 70-nm-thick aluminum oxide film is formed by a sputtering method, a 300-nm-thick silicon oxynitride film is formed by a CVD method, and then openings are formed, whereby the insulating film 113 is formed.

The second heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

An electric furnace, a rapid thermal annealing (RTA) apparatus, or the like can be used for the second heat treatment. With the use of an RTA apparatus, the heat treatment can be performed at a temperature higher than or equal to the strain point of the substrate if the heating time is short. Thus, the time during which oxygen is diffused from the base insulating film 103 to the oxide semiconductor film 105 can be shortened.

The second heat treatment may be performed under an atmosphere of nitrogen, oxygen, ultra-dry air (air with a water content of 20 ppm or less, 1 ppm or less, or 10 ppb or less), or a rare gas (argon, helium, or the like).

Here, heat treatment at 400° C. for one hour in an oxygen atmosphere is performed.

The wirings 115 are formed in such a manner that a conductive film is formed by a sputtering method, a CVD method, an evaporation method, or the like, a mask is formed over the conductive film, and the conductive film is etched. The mask formed over the conductive film can be formed by a printing method, an inkjet method, or a photolithography method as appropriate. Then, the mask is removed. Alternatively, the wirings 115 may be formed by a dual damascene method.

Here, a 50-nm-thick titanium film, a 200-nm-thick aluminum film, and a 50-nm-thick titanium film are stacked by a sputtering method. Next, a mask is formed by a photolithography process and the stacked-layer film is dry-etched with use of the mask to form the wirings 115.

Through the above process, the transistor with high on-state current and improved electrical characteristics can be manufactured. Furthermore, the semiconductor device with small variation in electrical characteristics and high reliability can be manufactured.

Note that the structures, methods, and the like described in this embodiment can be used as appropriate in combination with any of the structures, methods, and the like described in the other embodiments and examples.

Embodiment 2

In this embodiment, a transistor having a structure different from that of Embodiment 1 and a method for manufacturing the transistor is described with reference to FIGS. 3A to 3C, FIGS. 4A to 4D, and FIGS. 5A to 5D.

Figure 3A:
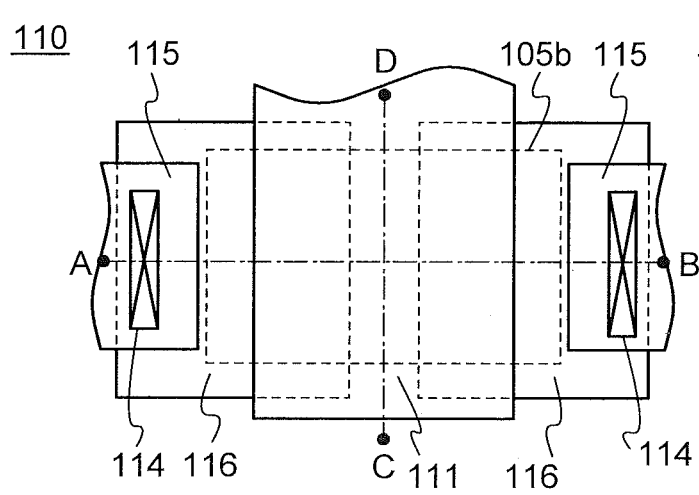
FIGS. 3A to 3C are a top view and cross-sectional views illustrating one embodiment of a transistor.
Figure 3C:
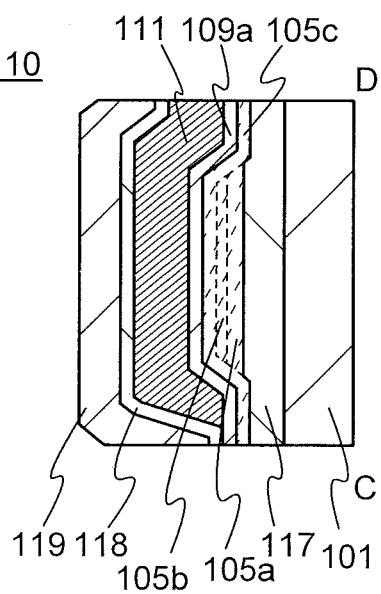
Figure 3B:
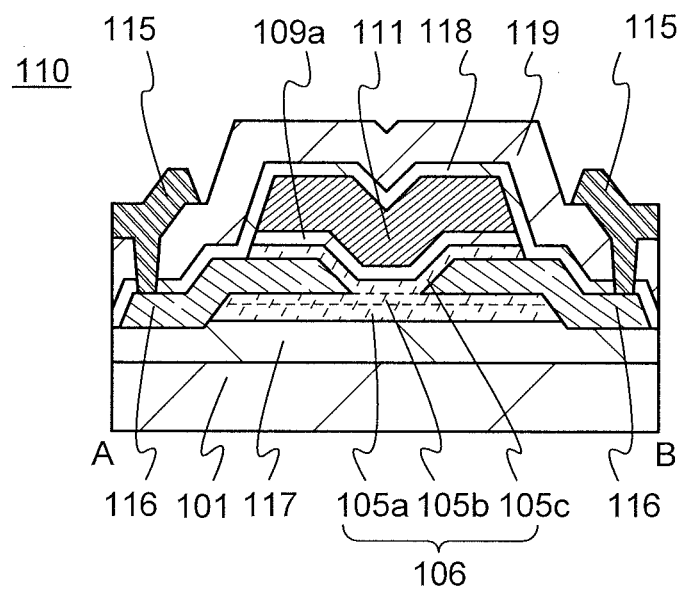

FIGS. 3A to 3C are a top view and cross-sectional views of a transistor 110. FIG. 3A is a top view of the transistor 110, FIG. 3B is a cross-sectional view taken along dashed line A-B of FIG. 3A, and FIG. 3C is a cross-sectional view taken along dashed line C-D of FIG. 3A. Note that in FIG. 3A, the substrate 101, an oxide semiconductor film 105a, an oxide semiconductor film 105c, a gate insulating film 109a, an insulating film 118, an insulating film 119, and the like are not illustrated for simplicity.

The transistor 110 illustrated in FIGS. 3A to 3C includes the oxide semiconductor film 105a over a base insulating film 117 over the substrate 101; an oxide semiconductor film 105b provided over the oxide semiconductor film 105a; a pair of electrodes 116 in contact with the oxide semiconductor film 105b; the oxide semiconductor film 105c in contact with the base insulating film 103, the oxide semiconductor film 105b, and the pair of electrodes 116; the gate insulating film 109a in contact with the oxide semiconductor film 105c; and the gate electrode 111 overlapping the oxide semiconductor film 105c with the gate insulating film 109a provided therebetween. Note that the oxide semiconductor film 105a, the oxide semiconductor film 105b, and the oxide semiconductor film 105c are collectively referred to as a multilayer film 106. The insulating film 118 covering the gate insulating film 109a, the gate electrode 111, and the pair of electrodes 116, and the insulating film 119 covering the insulating film 118 may be further provided. Furthermore, the wirings 115 in contact with the pair of electrodes 116 in openings 114 of the insulating film 118 and the insulating film 119 may be provided.

In a manner similar to that of the base insulating film 103 described in Embodiment 1, the base insulating film 117 can be formed using an oxide insulating film containing excess oxygen. Typically, the total of the amount of a gas having a mass-to-charge ratio of 30 released by the heat treatment and double of the amount of a gas having a mass-to-charge ratio of 32 released by the heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$. Alternatively, the total of the amount of the gas having a mass-to-charge ratio of 30 released by the heat treatment and double of the amount of the gas having a mass-to-charge ratio of 32 released by the heat treatment is greater than or equal to $1\times10^{20}/cm^3$ and less than or equal to $1\times10^{21}/cm^3$, or greater than or equal to $1\times10^{20}/cm^3$ and less than or equal to $5\times10^{20}/cm^3$.

Note that a typical example of the gas having a mass-to-charge ratio of 30 is nitrogen monoxide, and a typical example of the gas having a mass-to-charge ratio of 32 is oxygen. That is, the amount of released oxygen atoms derived from oxygen molecules and nitrogen monoxide which are released by the heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$. Alternatively, the amount of released oxygen atoms derived from oxygen molecules and nitrogen monoxide released by the heat treatment is greater than or equal to $1\times10^{20}/cm^3$ and less than or equal to $1\times10^{21}/cm^3$, or greater than or equal to $1\times10^{20}/cm^3$ and less than or equal to $5\times10^{20}/cm^3$.

Note that the base insulating film 117 described in this embodiment is partly etched at the time of etching the multilayer film 106, so that the base insulating film 117 has a projected portion in a region over which the multilayer film 106 is positioned.

The oxide semiconductor films 105a, 105b, and 105c are typically formed using an In—Ga oxide film, an In—Zn oxide film, or an In-M-Zn oxide film (M is Ti, Ga, Y, Zr, La, Cs, Nd, or Hf). The oxide semiconductor films 105a and 105c are formed using one or more kinds of elements contained in the oxide semiconductor film 105b. Therefore, interface scattering is unlikely to occur at interfaces between the oxide semiconductor films 105a, 105b, and 105c. Thus, the transistor can have high field-effect mobility because the movement of carriers is not hindered at the interface.

The energy of the bottom of the conduction band in each of the oxide semiconductor films 105a and 105c is closer to the vacuum level than the that in the oxide semiconductor film 105b, and typically, the difference between the energy of the bottom of the conduction band in each of the oxide semiconductor films 105a and 105c and the energy of the bottom of the conduction band in the oxide semiconductor film 105b is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of each of the oxide semiconductor films 105a and 105c and the electron affinity of the oxide semiconductor film 105b is any one of 0.05 eV or more, 0.07 eV or more, 0.1 eV or more, and 0.15 eV or more, and any one of 2 eV or less, 1 eV or less, 0.5 eV or less, and 0.4 eV or less.

When the oxide semiconductor films 105a and 105c contain a larger amount of Ga, Y, Zr, La, Cs, or Nd in an atomic ratio than the amount of In in an atomic ratio, any of the following effects may be obtained:

(1) the energy gap of each of the oxide semiconductor films 105a and 105c is widened;

(2) the electron affinity of each of the oxide semiconductor films 105a and 105c is reduced;

(3) scattering of impurities from the outside is reduced;

(4) an insulating property increases as compared to the oxide semiconductor film 105b; and (5) oxygen vacancy is less likely to be generated in the oxide semiconductor films 105a and 105c containing a larger amount of Ga, Y, Zr, La, Cs, or Nd in an atomic ratio than the amount of In in an atomic ratio because Ga, Y, Zr, La, Cs, or Nd is a metal element which is strongly bonded to oxygen.

In particular, in the case where the oxide semiconductor film 105b is an In-M-Zn oxide film (M is Ga, Y, Zr, La, Cs, or Nd) and a target having the atomic ratio of metal elements of In:M:Zn=$x_1$:$y_1$:$z_1$ is used for forming the oxide semiconductor layer 105b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor layer 105b is easily formed. Typical examples of the atomic ratio of the metal elements of the target are In:M:Zn=1:1:1 and In:M:Zn=3:1:2.

In the case where the oxide semiconductor films 105a and 105c are each an In-M-Zn oxide film (M is Ga, Y, Zr, La, Cs, or Nd), when a target used for depositing the oxide semiconductor films 105a and 105c has an atomic ratio of metal elements of In:M:Zn=$x_2$:$y_2$:$z_2$, $x_2/y_2 < x_1/y_1$ is satisfied and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films to be described later are easily formed as the oxide semiconductor films 105a and 105c. Typical examples of the atomic ratio of the metal elements of the target are In:M:Zn=1:3:2, In:M:Zn=1:3:4, In:M:Zn=1:6:4, and the like.

The atomic ratios of M/In and Zn/In of the oxide semiconductor films 105a, 105b, and 105c which are formed using the above targets are smaller than those of the target. The atomic ratio of Zn to M (Zn/M) in an In—Ga—Zn oxide film is higher than or equal to 0.5. Such a film becomes a CAAC-OS described later.

In the case where the oxide semiconductor film 105b is an In-M-Zn oxide film, the proportions of In and M when summation of In and M is assumed to be 100 atomic % are preferably as follows: the atomic percentage of In is greater than or equal to 25 atomic % and the atomic percentage of M is less than 75 atomic %, or the atomic percentage of In is greater than or equal to 34 atomic % and the atomic percentage of M is less than 66 atomic %.

In the case where the oxide semiconductor films 105a and 105c are each an In-M-Zn oxide film, the proportions of In and M when summation of In and M is assumed to be 100 atomic % are preferably as follows: the atomic percentage of In is less than 50 atomic % and the atomic percentage of M is greater than or equal to 50 atomic %, or the atomic percentage of In is less than 25 atomic % and the atomic percentage of M is greater than or equal to 75 atomic %.

Further, in the case where each of the oxide semiconductor films 105a, 105b, and 105c is an In-M-Zn oxide film (M represents Ti, Ga, Y, Zr, La, Cs, Nd, or Hf), the proportion of M (M represents Ga, Y, Zr, La, Cs, or Nd) in each of the oxide semiconductor films 105a and 105c is higher than that in the oxide semiconductor film 105b. Typically, the proportion of M in each of the oxide semiconductor films 105a and 105c is 1.5 or more times, twice or more, or three or more times as high as that in the oxide semiconductor film 105b.

Furthermore, in the case where each of the oxide semiconductor films 105a, 105b, and 105c is an In-M-Zn oxide film (M represents Ga, Y, Zr, La, Cs, or Nd), when In:M:Zn=$x_1$:$y_1$:$z_1$ [atomic ratio] is satisfied in each of the oxide semiconductor films 105a and 105c and In:M:Zn=$x_2$:$y_2$:$z_2$ [atomic ratio] is satisfied in the oxide semiconductor film 105b, $y_1/x_1$ is higher than $y_2/x_2$, or $y_1/x_1$ is 1.5 or more times as high as $y_2/x_2$. Alternatively, $y_1/x_1$ is twice or more as high as $y_2/x_2$, or $y_1/x_1$ is three or more times as high as $y_2/x_2$. In this case, it is preferable that in the oxide semiconductor film 105b, $y_2$ be higher than or equal to $x_2$ because a transistor including the oxide semiconductor film 105b can have stable electric characteristics.

A formation process which is similar to that of the oxide semiconductor film 105 in Embodiment 1 can be used for the oxide semiconductor films 105a, 105b, and 105c.

Note that the oxide insulating film 105c also functions as a film which relieves damage to the oxide semiconductor film 105b at the time of forming the gate insulating film 109a later. Consequently, the amount of oxygen vacancy in the oxide semiconductor film 105b can be reduced. In addition, by forming the oxide semiconductor film 105c, mixing of a constituent element of an insulating film, e.g., the oxide insulating film, formed over the oxide semiconductor film 105b to the oxide semiconductor film 105b can be inhibited.

The thickness of the oxide semiconductor film 105b is greater than or equal to 3 nm and less than or equal to 200 nm, greater than or equal to 3 nm and less than or equal to 100 nm, or greater than or equal to 3 nm and less than or equal to 50 nm.

The thickness of each of the oxide semiconductor films 105a and 105c is greater than or equal to 0.3 nm and less than or equal to 200 nm, greater than or equal to 3 nm and less than or equal to 100 nm, or greater than or equal to 3 nm and less than or equal to 50 nm.

Note that the thickness of the oxide semiconductor film 105a is preferably larger than that of the oxide semiconductor film 105b. The thickness of the oxide semiconductor film 105c is preferably smaller than that of the oxide semiconductor film 105b.

In the case where the thickness of the oxide semiconductor film 105a is too small, electrons are captured at the interface between the oxide semiconductor film 105a and the oxide semiconductor film 105b, and the on-state current of the transistor is decreased. On the other hand, in the case where the thickness of the oxide semiconductor film 105a is too large, the amount of oxygen transferred from the base insulating film 117 to the oxide semiconductor film 105b is decreased, and thus it is difficult to reduce the amount of oxygen vacancy and the amount of hydrogen in the oxide semiconductor film 105b. Therefore, the thickness of the oxide semiconductor film 105a is preferably larger than that of the oxide semiconductor film 105b, and greater than or equal to 20 nm and less than or equal to 200 nm.

When a large number of electrons are induced to the oxide semiconductor film 105c, the oxide semiconductor film 105c blocks the electric field of the gate electrode, so that the electric field applied to the oxide semiconductor film 105b is weakened. As a result, the on-state current of the transistor is decreased. Therefore, the thickness of the oxide semiconductor film 105c is preferably smaller than that of the oxide semiconductor film 105b, and greater than or equal to 0.3 nm and less than or equal to 10 nm.

Like the oxide semiconductor film 105b, the oxide semiconductor films 105a and 105c can have a single crystal structure or a non-single-crystal structure as appropriate. The non-single crystal structure includes a c-axis aligned crystalline oxide semiconductor (CAAC-OS) which is described later, a polycrystalline structure, a microcrystalline structure described later, or an amorphous structure, for example.

Note that the oxide semiconductor films 105a, 105b, and 105c may each be a mixed film including two or more of the following: a region having an amorphous structure, a region having a microcrystalline structure, a region having a polycrystalline structure, a region of CAAC-OS described later, and a region having a single-crystal structure. The mixed film has a single-layer structure including, for example, two or more of a region having an amorphous structure, a region having a microcrystalline structure, a region having a polycrystalline structure, a region of CAAC-OS described later, and a region having a single-crystal structure in some cases. Further, the mixed film has a stacked-layer structure including, for example, two or more of a region having an amorphous structure, a region having a microcrystalline structure, a region having a polycrystalline structure, a region of CAAC-OS described later, and a region having a single-crystal structure in some cases. Further, the oxide semiconductor film 105a may have a microcrystalline structure and the oxide semiconductor films 105b and 105c may be a CAAC-OS. Alternatively, the oxide semiconductor film 105a may have a stacked-layer structure of a microcrystalline structure and CAAC-OS described later, and the oxide semiconductor films 105b and 105c may be CAAC-OS.

It is preferable that the oxide semiconductor films 105a, 105b, and 105c each be CAAC-OS described later, in which case the crystallinity at the interface between the oxide semiconductor films 105a, 105b, and 105c can be increased.

Note that a channel formation region refers to a region of the multilayer film 106 which is positioned between the pair of electrodes 116 and over which the gate electrode 111 is provided. Further, a channel region refers to a region of the channel formation region through which current mainly flows. Here, a channel region is part of the oxide semiconductor film 105b which is positioned between the pair of electrodes 116. A channel length refers to a distance between the pair of electrodes 116.

Here, the oxide semiconductor film 105c is provided between the oxide semiconductor film 105b and the gate insulating film 109a. Hence, if trap states are formed between the oxide semiconductor film 105c and the gate insulating film 109a owing to impurities and defects, there is a distance between the trap states and the oxide semiconductor film 105b. As a result, electrons flowing in the oxide semiconductor film 105b are less likely to be captured by the trap states. Accordingly, the amount of on-state current of the transistor can be increased, and the field-effect mobility can be increased. When the electrons are captured by the trap states, the electrons become negative fixed charges. As a result, the threshold voltage of the transistor fluctuates. However, since the distance between the oxide semiconductor film 105b and the trap states exists, capture of the electrons by the trap states can be reduced, and accordingly a change in the threshold voltage can be reduced.

Further, diffusion of impurities from the outside can be reduced by the oxide semiconductor film 105c, and accordingly, the amount of impurities which are transferred from the outside to the oxide semiconductor film 105b can be reduced. Further, oxygen vacancy is less likely to be formed in the oxide semiconductor film 105c. Consequently, the impurity concentration and the amount of oxygen vacancy in the oxide semiconductor film 105b can be reduced.

Note that at least the oxide semiconductor films 105a and 105b are not formed by simply stacking each film, but are formed to form a continuous junction (here, in particular, a structure in which the energy of the bottom of the conduction band is changed continuously between the films). In other words, a stacked-layer structure in which there exist no impurity which forms a defect level such as a trap center or a recombination center at each interface is provided. If an impurity exists between the oxide semiconductor films 105a and 105b which are stacked, a continuity of the energy band is damaged, and the carrier is captured or recombined at the interface and then disappears.

In order to form such a continuous junction it is necessary to form films continuously without being exposed to air, with use of the multi-chamber deposition apparatus including a load lock chamber.

Since the oxide semiconductor film 105c is provided between the oxide semiconductor film 105b and the gate insulating film 109a in the transistor described in this embodiment, the concentration of silicon or carbon of the oxide semiconductor film 105b or the concentration of silicon or carbon in the vicinity of the interface between the oxide semiconductor film 105b and each of the oxide semiconductor films 105a and 105c can be reduced.

Since the transistor 110 having such a structure includes very few defects in the multilayer film 106 including the oxide semiconductor film 105b, the electrical characteristics of the transistor can be improved, and typically, the on-state current can be increased and the field-effect mobility can be improved. Further, in a BT stress test and a BT photostress test which are examples of a stress test, the amount of change in threshold voltage is small, and thus, reliability is high.

The gate insulating film 109a can be formed using the material of the gate insulating film 109 of the transistor 100 described in Embodiment 1, as appropriate. Note that the end portion of the gate insulating film 109a described in this embodiment is substantially aligned with the end portion of the gate electrode 111.

In the transistor 110 described in this embodiment, the end portions of the oxide semiconductor film 105c and the gate insulating film 109a are substantially aligned with the end portion of the gate electrode 111.

In the transistor 110, an etching residue generated at the time of forming the gate electrode 111 can be removed when the oxide semiconductor film 105c and the gate insulating film 109a are formed; thus, leakage current generated between the gate electrode 111 and the wirings 115 can be reduced.

The pair of electrodes 116 can be formed as appropriate using a method similar to that of the pair of electrodes 107 described in Embodiment 1. The distance between the pair of electrodes 116 facing each other in this embodiment is smaller than that between the pair of electrodes 107 described in Embodiment 1.

The insulating films 118 and 119 may each be formed with a single layer or a stack including one or more of a silicon oxide film, a silicon oxynitride film, a silicon nitride oxide film, a silicon nitride film, an aluminum oxide film, an aluminum oxynitride film, an aluminum nitride oxide film, an aluminum nitride film, and the like. The total thickness of the insulating film 118 and the insulating film 119 is preferably greater than or equal to 30 nm and less than or equal to 500 nm, or greater than or equal to 100 nm and less than or equal to 400 nm.

Next, a method for manufacturing the semiconductor device is described with reference to FIGS. 4A to 4D and FIGS. 5A to 5C.

Figure 4A:
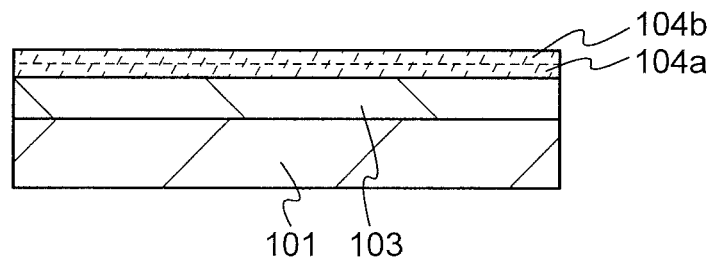
FIGS. 4A to 4D are cross-sectional views illustrating one embodiment of a method for manufacturing a transistor.

As illustrated in FIG. 4A, the base insulating film 103 is formed over the substrate 101, and an oxide semiconductor film 104a and an oxide semiconductor film 104b are formed over the base insulating film 103.

Here, a silicon wafer is used as the substrate 101.

In a manner similar to that of Embodiment 1, an oxynitride insulating film which contains oxygen at a higher proportion than oxygen in the stoichiometric composition is formed as the base insulating film 103.

Here, in a manner similar to that of Embodiment 1, a 300-nm-thick silicon oxynitride film is formed as the base insulating film 103 by a CVD method.

The oxide semiconductor film 104a and the oxide semiconductor film 104b can be formed by a sputtering method, a coating method, a pulsed laser deposition method, a laser ablation method, or the like.

Here, a 20-nm-thick In—Ga—Zn oxide film is formed as the oxide semiconductor film 104a by a sputtering method using a target with an atomic ratio of metal elements of In:Ga:Zn=1:3:4. Here, a 15-nm-thick In—Ga—Zn oxide film is formed as the oxide semiconductor film 104b by a sputtering method using a target with an atomic ratio of metal elements of In:Ga:Zn=1:1:1.2.

Next, by performing first heat treatment, oxygen is preferably transferred from the base insulating film 103 to the oxide semiconductor film 104a and the oxide semiconductor film 104b. Furthermore, impurities included in the oxide semiconductor film 104a and the oxide semiconductor film 104b are preferably removed.

The first heat treatment can be performed under conditions similar to those of the first heat treatment described in Embodiment 1.

The heat treatment makes it possible to move part of oxygen in the base insulating film 103 to the oxide semiconductor films 104a and 104b and reduce the amount of oxygen vacancy of the oxide semiconductor films 104a and 104b. Note that the oxygen content of the base insulating film 103 is reduced by the heat treatment.

Here, heat treatment is performed in an atmosphere containing nitrogen at 450° C. for one hour, and then heat treatment is performed in an atmosphere of nitrogen and oxygen at 450° C. for one hour.

Through the above process, the oxygen vacancy of the oxide semiconductor films 104a and 104b and the interface states between the base insulating film 103 and the oxide semiconductor film 104a can be reduced.

Note that the heat treatment may be performed in a later step, not this step. In other words, in another heating step performed later, part of oxygen in the base insulating film 103 may be transferred to the oxide semiconductor films 104a and 104b. In this case, the number of heating steps can be reduced.

Figure 4B:
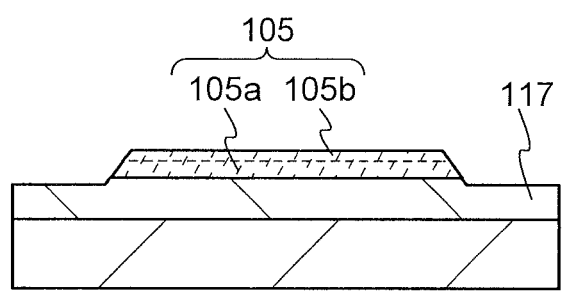

Then, after a mask is formed over the oxide semiconductor film 104b by a photolithography process, the oxide semiconductor film 104a and the oxide semiconductor film 104b are each partly etched using the mask. Accordingly, the oxide semiconductor film 105a and the oxide semiconductor film 105b are formed as illustrated in FIG. 4B. After that, the mask is removed. Note that in the etching step, the base insulating film 103 is partly etched in some cases. Here, the base insulating film 103 which is partly etched is referred to as the base insulating film 117.

Figure 4C:
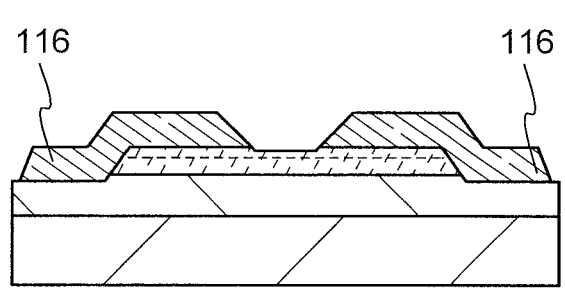

Next, as illustrated in FIG. 4C, the pair of electrodes 116 is formed over the oxide semiconductor film 105b. Then, an oxide semiconductor film 104c is formed over the oxide semiconductor film 105b and the pair of electrodes 116, and then the gate insulating film 108 is formed over the oxide semiconductor film 104c.

The pair of electrodes 116 can be formed in a manner similar to that of the pair of electrodes 107 described in Embodiment 1.

Note that in the case where a transistor has an extremely short channel length, at least a region to divide a pair of electrodes 107 is etched using resist masks that are processed by a method suitable for fine line processing, such as electron beam exposure. Note that by the use of a positive type resist for the resist masks, the exposed region can be minimized and throughput can be thus improved. In the above manner, a transistor having a channel length of 100 nm or less, further, 30 nm or less can be formed. Alternatively, minute processing may be performed by an exposure technology which uses light with an extremely short wavelength (e.g., extreme ultraviolet (EUV)), X-rays, or the like.

Here, a 100-nm-thick tungsten film is stacked by a sputtering method. Next, a mask is formed over the tungsten film by a photolithography process and the tungsten film is dry-etched with use of the mask to form the pair of electrodes 116.

In a manner similar to that in Embodiment 1, after the pair of electrodes 116 is formed, cleaning treatment is preferred to be performed to remove an etching residue.

Figure 4D:
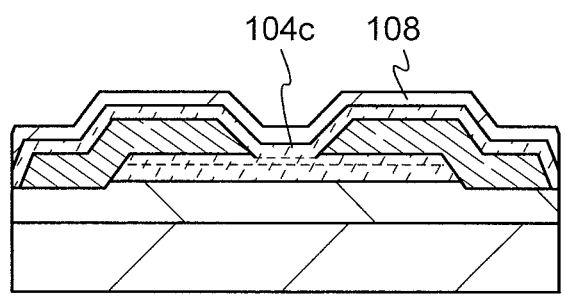

Next, as illustrated in FIG. 4D, the oxide semiconductor film 104c is formed over the oxide semiconductor film 105b and the pair of electrodes 116, and a gate insulating film 108 is formed over the oxide semiconductor film 104c.

The oxide semiconductor film 104c can be formed in a manner similar to that of the oxide semiconductor film 105a. The gate insulating film 108 can be formed in a manner similar to that of the gate insulating film 109 in Embodiment 1.

Here, a 5-nm-thick In—Ga—Zn oxide film is formed as the oxide semiconductor film 104c by a sputtering method using a target having an atomic ratio of In:Ga:Zn=1:3:4. Furthermore, as the gate insulating film 108, a 20-nm-thick silicon oxynitride film is formed by a CVD method.

Figure 5A:
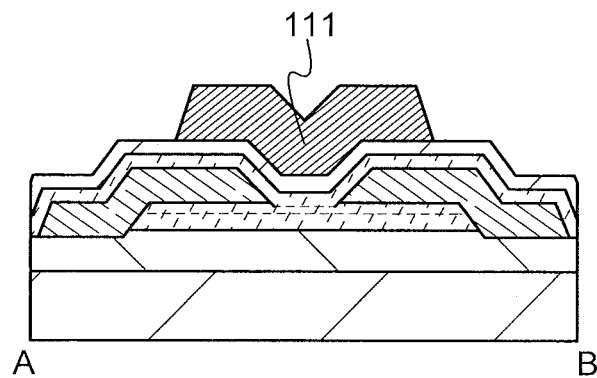
FIGS. 5A to 5C are cross-sectional views each illustrating one embodiment of a transistor.

Then, as illustrated in FIG. 5A, the gate electrode 111 is formed in a region which is over the gate insulating film 108 and overlaps the oxide semiconductor film 105b in a manner similar to that of Embodiment 1.

In this embodiment, a 30-nm-thick titanium nitride film and a 135-nm-thick tungsten film are formed in this order by a sputtering method. Next, a mask is formed by a photolithography process, and the titanium nitride film and the tungsten film are subjected to dry etching with use of the mask to form the gate electrode 111.

Figure 5B:
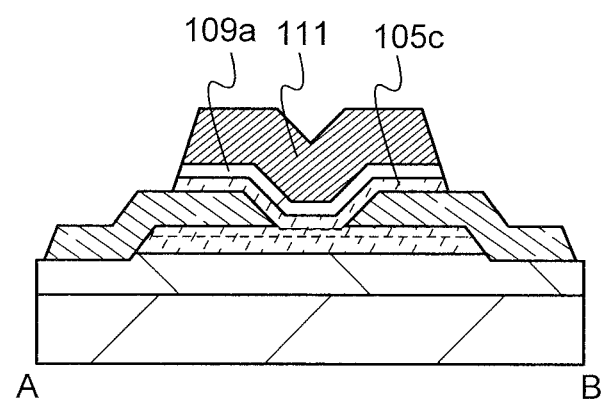

Next, as illustrated in FIG. 5B, the oxide semiconductor film 104c and the gate insulating film 108 are etched using the gate electrode 111 as a mask to form the oxide semiconductor film 105c and the gate insulating film 109a. Accordingly, the oxide semiconductor film 105c and the gate insulating film 109a can be formed without an increase in the number of photomasks. Furthermore, the end portions of the oxide semiconductor film 105c and the gate insulating film 109a are substantially aligned with the end portion of the gate electrode 111.

In the transistor 110, an etching residue generated at the time of forming the gate electrode 111 can be removed when the oxide semiconductor film 105c and the gate insulating film 109a are formed; thus, leakage current generated between the gate electrode 111 and the wirings 115 which are formed later can be reduced.

Figure 5C:
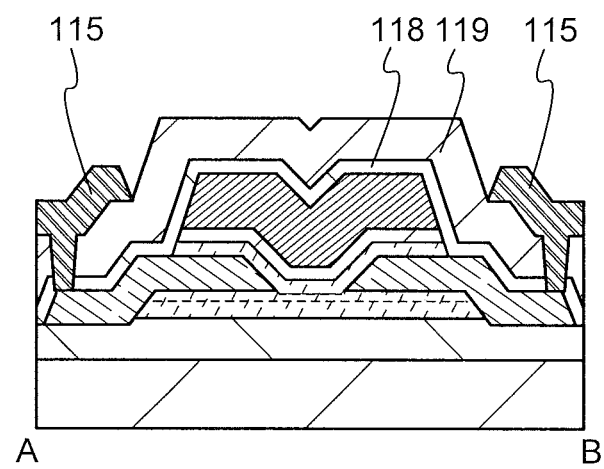

Next, as illustrated in FIG. 5C, the insulating film 118 and the insulating film 119 are stacked in this order over the pair of electrodes 116 and the gate electrode 111. Next, second heat treatment is performed. Then, openings are formed in the insulating film 118 and the insulating film 119, and the wirings 115 are formed.

The insulating film 118 and the insulating film 119 can be formed by a sputtering method, a CVD method, or the like as appropriate. When an oxygen blocking film is used as the insulating film 118, release of oxygen from the multilayer film 106 in later heat treatment can be reduced. Thus, electrical characteristic variation of the transistor can be reduced, and change in threshold voltage can be inhibited.

The second heat treatment is performed using the conditions of the second heat treatment described in Embodiment 1 as appropriate.

Here, a 70-nm-thick aluminum oxide film is formed as the insulating film 118 by a sputtering method, and a 300-nm-thick silicon oxynitride film is formed as the insulating film 119 by a CVD method. Furthermore, heat treatment is performed in an oxygen atmosphere at 450° C. for one hour. After that, a mask is formed through a photolithography process, and the insulating film 118 and the insulating film 119 are partly etched by a dry etching method using the mask, whereby openings are formed.

The wirings 115 can be formed in a manner similar to that of the pair of electrodes 116. Alternatively, the wirings 115 can be formed by a damascene method.

Here, a 50-nm-thick titanium film, a 200-nm-thick aluminum film, and a 50-nm-thick titanium film are stacked in this order by a sputtering method. Next, a mask is formed by a photolithography process and the tungsten film, the aluminum film, and the titanium film are subjected to dry etching with use of the mask to form the wirings 115.

Through the above steps, the transistor 110 can be manufactured.

The oxide semiconductor film 105a is formed by a sputtering method using a target having an atomic ratio of In:Ga:Zn=1:3:4, the oxide semiconductor film 105b is formed by a sputtering method using a target having an atomic ratio of In:Ga:Zn=1:1:1 or 3:1:2, and the oxide semiconductor film 105c is formed by a sputtering method using a target having an atomic ratio of In:Ga:Zn=1:3:4, whereby a well-shaped structure in which the bottom of the conduction band in the oxide semiconductor film 105b is lower from the vacuum level than the bottoms of the conduction band in the oxide semiconductor film 105a and the oxide semiconductor film 105c can be obtained, and the concentration of silicon or carbon in the oxide semiconductor film 105b serving as a carrier path can be reduced; therefore, the field-effect mobility of the transistor can be increased, and the amount of change in the threshold voltage of the transistor due to change over time or a reliability test can be reduced.

After the oxide semiconductor film to be the oxide semiconductor film 105c, the insulating film to be the gate insulating film 109a, and the conductive film to be the gate electrode 111 are formed over the base insulating film 103, the oxide semiconductor film 105b, and the pair of electrodes 107, a mask is formed over the conductive film through a photolithography process and the oxide semiconductor film, the insulating film, and the conductive film are etched using the mask, whereby the oxide semiconductor film 105c, the gate insulating film 109a, and the gate electrode 111 can be formed at the same time.

Through the above steps, a transistor which has a multilayer film including an oxide semiconductor film and having a low density of localized levels and which has excellent electrical characteristics can be manufactured. In addition, a highly reliable transistor in which a variation in electric characteristics with time or a variation in electric characteristics due to a stress test is small can be manufactured.

Note that the structures, methods, and the like described in this embodiment can be used as appropriate in combination with any of the structures, methods, and the like described in other embodiments, modification examples thereof, and examples.

Embodiment 3

In this embodiment, a transistor having a structure different from those of Embodiments 1 to 3 are described with reference to FIG. 6. The transistor in this embodiment includes a plurality of gate electrodes facing each other with an oxide semiconductor film positioned therebetween. Note that in this embodiment, description is made using the transistor described in Embodiment 1; however, this embodiment can be combined with the other embodiments as appropriate.

Figure 6:
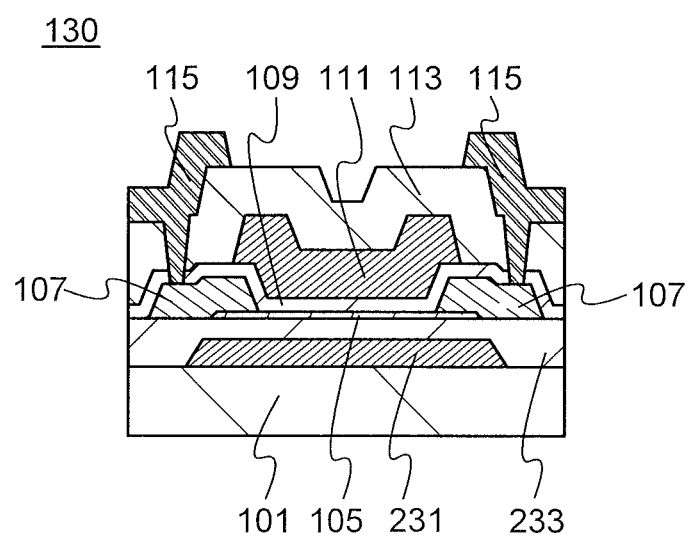
FIG. 6 is a cross-sectional view illustrating one embodiment of a transistor.

A transistor 130 illustrated in FIG. 6 includes a gate electrode 231 over the substrate 101 and an insulating film 233 covering the gate electrode 231. Further, the transistor includes the oxide semiconductor film 105 over the insulating film 233, the pair of electrodes 107 in contact with the oxide semiconductor film 105, the gate insulating film 109 in contact with the insulating film 233, the oxide semiconductor film 105, and the pair of electrodes 107, and the gate electrode 111 overlapping with the oxide semiconductor film 105 with the gate insulating film 109 positioned therebetween. In addition, the insulating film 113 covering the gate insulating film 109 and the gate electrode 111 is provided. Furthermore, the wirings 115 may be provided in contact with the pair of electrodes 107 through openings formed in the gate insulating film 109 and the insulating film 113.

The gate electrode 231 can be formed in a manner similar to that of the gate electrode 111 in Embodiment 1. Note that the gate electrode 231 preferably has a tapered side surface in order to improve coverage with the insulating film 233 that is to be formed. An angle between the substrate 101 and the gate electrode 231 is greater than or equal to 20° and less than or equal to 70°, or greater than or equal to 30° and less than or equal to 60°.

The insulating film 233 can be formed in a manner similar to that of the base insulating film 103 in Embodiment 1. Typically, the insulating film 233 is an oxide insulating film, and the total of the amount of a gas having a mass-to-charge ratio of 30 released from the oxide insulating film by heat treatment and double of the amount of a gas having a mass-to-charge ratio of 32 released from the oxide insulating film by heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$. Alternatively, the insulating film 233 is an oxide insulating film, and the total of the amount of a gas having a mass-to-charge ratio of 30 released from the oxide insulating film by heat treatment and double of the amount of a gas having a mass-to-charge ratio of 32 released from the oxide insulating film by heat treatment is greater than or equal to $1\times10^{20}/cm^3$ and less than or equal to $1\times10^{21}/cm^3$, or greater than or equal to $1\times10^{20}/cm^3$ and less than or equal to $5\times10^{20}/cm^3$.

Note that a typical example of the gas having a mass-to-charge ratio of 30 is nitrogen monoxide, and a typical example of the gas having a mass-to-charge ratio of 32 is oxygen. That is, the amount of released oxygen atoms derived from oxygen molecules and nitrogen monoxide which are released by the heat treatment is greater than or equal to $5\times10^{15}/cm^2$ and less than or equal to $5\times10^{16}/cm^2$, or greater than or equal to $5\times10^{15}/cm^2$ and less than or equal to $3\times10^{16}/cm^2$. Alternatively, the amount of released oxygen atoms derived from oxygen molecules and nitrogen monoxide released by the heat treatment is greater than or equal to $1\times10^{20}/cm^3$ and less than or equal to $1\times10^{21}/cm^3$, or greater than or equal to $1\times10^{20}/cm^3$ and less than or equal to $5\times10^{20}/cm^3$.

Note that the insulating film 233 preferably has a flat surface because the oxide semiconductor film 105 is formed over the insulating film 233 in a later step. Thus, an insulating film that is to be the insulating film 233 is formed over the substrate 101 and the gate electrode 231, and the insulating film is subjected to planarization treatment by CMP or the like, so that the insulating film 233 with less surface unevenness is formed.

The transistor 130 in this embodiment has the gate electrode 231 and the gate electrode 111 facing each other with the oxide semiconductor film 105 positioned therebetween. By application of different potentials to the gate electrode 231 and the gate electrode 111, the threshold voltage of the transistor 130 can be controlled: preferably, the threshold voltage can be shifted in the positive direction. Alternatively, the same potential may be applied to the gate electrode 231 and the gate electrode 111. Further alternatively, the potential of the gate electrode 231 may be a fixed potential or a ground potential.

Through the above process, the oxynitride insulating film which contains oxygen at a higher proportion than oxygen in the stoichiometric composition, as described in Embodiment 1, is formed as the base insulating film over which the oxide semiconductor film is formed, and the transistor including an oxide semiconductor film is provided over the base insulating film, whereby the transistor with high on-state current and improved electrical characteristics can be manufactured. In addition, a highly reliable semiconductor device in which electrical characteristics variation due to a change over time or a stress test is small can be manufactured.

Further, since in the transistor in this embodiment, two gate electrodes face each other with the oxide semiconductor film positioned therebetween, electric characteristics of the transistor can be easily controlled.

Note that the structures, methods, and the like described in this embodiment can be used as appropriate in combination with any of the structures, methods, and the like described in the other embodiments and examples.

Embodiment 4

In this embodiment, the base insulating film 103, the base insulating film 117, the insulating film 113 and the insulating film 233 which are applicable to Embodiments 1 to 3 are described with reference to FIG. 7. Although the description of this embodiment is made using the transistor 100 described in Embodiment 1, the same applies to the base insulating film 103, the base insulating film 117, the insulating film 113 and the insulating film 233 of any of the transistors of the other embodiments.

Figure 7:
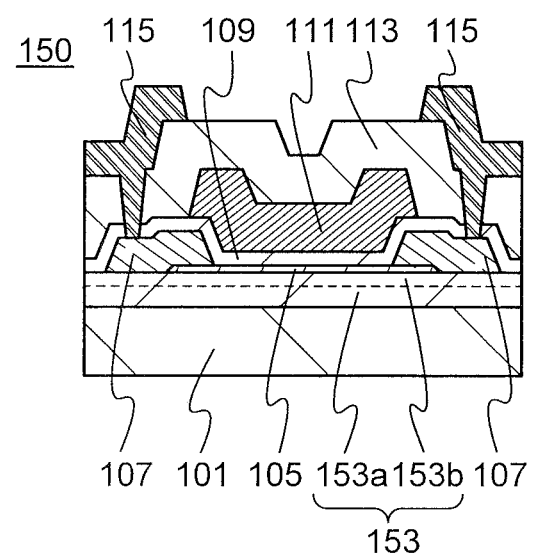
FIG. 7 is cross-sectional view illustrating one embodiment of a transistor.

As illustrated in FIG. 7, a transistor 150 described in this embodiment is different from those of Embodiments 1 to 3 in that a base insulating film is formed between the substrate 101 and the oxide semiconductor film 105, using a plurality of insulating films formed under conditions at different temperatures.

As for the deposition conditions of the base insulating film, when the deposition temperature is low, typically, a temperature is lower than or equal to 300° C., the amount of oxygen released by heating is large. However, the base insulating film deposited at the temperature includes a defect, which causes a reduction in the reliability of the transistor. On the other hand, as for the deposition conditions of the base insulating film, when the deposition temperature is low, typically, a temperature is higher than or equal to 350° C., the amount of defects included in the deposited base insulating film is small, which increases the reliability of the transistor. However, the amount of oxygen which is released by heat treatment from the base insulating film deposited at the temperature is small. Therefore, in the case where the transistor including the oxide semiconductor film in contact with the base insulating film has a short channel length, typically, a channel length of 1 µm or less, the amount of oxygen moved from the base insulating film to the oxide semiconductor film by heat treatment is small, and thus the oxide semiconductor film includes a large amount of oxygen vacancy. As a result, the threshold voltage becomes negative.

Thus, a stacked-layer film including an insulating film 153a and an insulating film 153b is formed as a base insulating film 153, and the insulating film 153a and the insulating film 153b are deposited at different temperatures, whereby the base insulating film 153 in which the amount of defects and the amount of released oxygen are controlled can be formed.

Furthermore, the amount of oxygen vacancy in the oxide semiconductor film 105 formed over the base insulating film 153 varies depending on the atomic ratio of metal elements contained in the oxide semiconductor film 105. For example, in the case where an In—Ga—Zn oxide film is used as the oxide semiconductor film 105, as the metal atomic proportion of Ga is reduced, the amount of oxygen vacancy in the oxide semiconductor film 105 is increased. Typically, an oxide semiconductor film which is deposited using a target having an atomic ratio of In:Ga:Zn=3:1:2 has a larger amount of oxygen vacancy than an oxide semiconductor film which is deposited using a target having an atomic ratio of In:Ga:Zn=1:1:1. The threshold voltage of a transistor including an oxide semiconductor film deposited using a target having an atomic ratio of In:Ga:Zn=3:1:2 is shifted in the negative direction more easily; therefore, the base insulating film 153 is preferably formed using an insulating film from which a large amount of oxygen is released by heating.

Thus, the thicknesses and deposition temperatures of the insulating film 153a and the insulating film 153b are controlled in accordance with the atomic ratio of the metal elements contained in the oxide semiconductor film 105, whereby the oxygen vacancy of the oxide semiconductor film 105 can be reduced, and the transistor can have high reliability.

Embodiment 5

In this embodiment, a semiconductor device and a method for manufacturing the semiconductor device is described with reference to FIG. 8 and FIGS. 9A to 9C. The semiconductor device includes a transistor formed using a first semiconductor material in a lower portion and a transistor formed using a second semiconductor material in an upper portion, and the transistor formed using the first semiconductor material includes a semiconductor substrate. As the semiconductor substrate included in the transistor using the first semiconductor material, a single crystal semiconductor substrate or a polycrystalline semiconductor substrate made of silicon, silicon carbide, or the like, a compound semiconductor substrate made of silicon germanium or the like, an SOI substrate, or the like can be used. Here, a single crystal silicon wafer is used as the semiconductor substrate. Furthermore, as the transistor using the second semiconductor material, the transistor using including an oxide semiconductor described in any of Embodiments 1 to 6 is used.

First, a structure of the semiconductor device is described with reference to FIG. 8.

A transistor 305 and a transistor 306, which are formed using a semiconductor substrate 301, are an n-channel transistor (NMOSFET) and a p-channel transistor (PMOSFET), respectively. The transistor 305 and the transistor 306 are electrically isolated from other elements by a shallow trench isolation (STI) 303. The use of the STI 303 can reduce the generation of a bird's beak in an element isolation region, which is caused in an LOCOS element isolation method, and can reduce the size of the element isolation region. On the other hand, in a semiconductor device that is not required to be structurally miniaturized or downsized, the STI 303 is not necessarily formed and an element isolation means such as LOCOS can be used.

The transistor 305 includes a channel region 307 in the semiconductor substrate 301, impurity regions 309 (also referred to as a source region and a drain region) which are provided such that the channel region 307 is provided therebetween, a gate insulating film 311 over the channel region 307, and a gate electrode 313 over the gate insulating film 311 so as to overlap with the channel region. The gate electrode 313 can be a single layer or a multilayer. Note that the gate electrode 313 may have a stacked-layer structure of a first conductive film formed using a first material for improving processing accuracy and a second conductive film formed using a second material for reducing resistance.

Between the impurity regions 309 and the channel region 307, impurity regions 315 different from the impurity regions 309 are provided. The impurity regions 315 function as LDD regions or extension regions for controlling the distribution of an electric field in the vicinity of the channel region, depending on the concentration of an impurity introduced thereto. At the side walls of the gate electrode 313, sidewalls 317 are provided. With the sidewalls 317, the impurity regions 315 can be formed.

The transistor 306 includes a channel region 308 provided in an n-well region 304, impurity regions 310 (also referred to as a source region and a drain region) which are provided such that the channel region 308 is provided therebetween, a gate insulating film 312 provided over the channel region 308, and a gate electrode 314 provided over the gate insulating film 312 so as to overlap with the channel region. The gate electrode 314 can be a single layer or a multilayer.

In addition, impurity regions 316 which are different from the impurity regions 310 are provided between the impurity regions 310 and the channel region 308. The impurity regions 316 function as LDD regions or extension regions for controlling the distribution of an electric field in the vicinity of the channel region, depending on the concentration of an impurity introduced thereto. At the side walls of the gate electrode 314, sidewalls 318 are provided. With the sidewalls 318, the impurity regions 310 can be formed.

An insulating film 321 and an insulating film 323 are provided over the transistor 305 and the transistor 306. In the insulating film 321 and the insulating film 323, openings are provided, and in the openings, contact plugs 325 connecting the impurity region 309 and the impurity region 310 are provided. The contact plugs 325 serve as a source electrode and a drain electrode of the transistor 305 and the transistor 306. Further, the contact plugs 325 are connected to wirings 329 embedded in an insulating film 327 over the insulating film 323.

The insulating film 321 can function as a protective film and can prevent impurities from entering the channel region from the outside. In addition, when the insulating film 321 is formed using a material such as silicon nitride by a CVD method, hydrogenation of single crystal silicon can be performed by heat treatment in the case where the single crystal silicon is used for the channel region. When an insulating film having tensile stress or compressive stress is used as the insulating film 321, distortion can be caused in the semiconductor material in the channel region. By subjecting a silicon material in the channel region to tensile stress in the case of an n-channel transistor or subjecting a silicon material in the channel region to compressive stress in the case of a p-channel transistor, the mobility of the transistor can be improved.

For the insulating film 321 and the insulating film 323, it is possible to use an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide made from $Si(OC_2H_5)_4$, hydrogen silsesquioxane (HSQ), methyl silsesquioxane (MSQ), organosilicate glass (OSG), or an organic-polymer-based material. In particular, in the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. After the conductive films are embedded in the openings which are provided in the insulating film, CMP treatment is performed to form the contact plugs; thus, mechanical strength is required for the insulating film. As long as their mechanical strength can be secured, the interlayer insulating films can be made porous to have a lower dielectric constant.

The contact plugs 325 are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given.

For the wirings 329, it is preferable to use a low-resistance conductive material such as copper or aluminum. By using a low-resistance conductive material, wiring delay of signals transmitted through the wirings 329 can be reduced. In the case where copper is used for the wirings 329, a barrier film is preferred to be formed between the insulating film 323 and the wirings 329 in order to prevent copper from dispersing into the channel region of the semiconductor substrate 301. The barrier film can be a tantalum nitride film, a stack including a tantalum nitride film and a tantalum film, a titanium nitride film, or a stack including a titanium nitride film and a titanium film, for example, but is not limited to the film of these materials as long as its function of preventing diffusion of a wiring material and its adhesion to the wiring material, a base film, or the like are secured.

Over the insulating film 327 and the wirings 329, an insulating film 331 and a barrier film 332 are stacked. Over the barrier film 332, an insulating film 333 is formed, and wirings 335a, 335b, and 335c are embedded in the insulating film 333.

The wiring 335a and the wiring 335b are connected to any of wirings 329 through contact plugs (not shown) embedded in the insulating film 331 and the barrier film 332.

The barrier film 332 is preferably formed using an insulating film having a blocking effect against hydrogen, water, and oxygen. Typically, the barrier film 332 can be formed using aluminum oxide, aluminum oxynitride film, allium oxide, gallium oxynitride, yttrium oxide, yttrium oxynitride, hafnium oxide, hafnium oxynitride, silicon nitride, or the like.

Although the barrier film 332 is provided over the insulating film 331, the position is not limited thereto as long as it is between an insulating film 343 and the transistors 305 and 306.

An insulating film 343 is provided over the insulating film 333 and the wirings 335a, 335b, and 335c. Further, openings are provided in the insulating film 343, and a contact plug 345a and a contact plug 345b which are connected to the wiring 335a and the wiring 335b, respectively, are provided in the openings.

A transistor 349 is provided over the insulating film 343, the contact plugs 345a and 345b. As the transistor 349, any of the transistors described in Embodiments 1 to 6 can be used as appropriate. Here, the transistor 349 includes including an oxide semiconductor film 351, a pair of electrodes 353 and 355 in contact with the oxide semiconductor film 351, a gate insulating film 357 covering the oxide semiconductor film 351 and the pair of electrodes 353 and 355, and a gate electrode 359 overlapping the oxide semiconductor film 351 with the gate insulating film 357 provided therebetween.

In addition, over the transistor 349, an insulating film 365 is stacked. Further, an insulating film 367 may be provided over the insulating film 365.

The insulating film 343 can be formed using an oxynitride insulating film which contains oxygen at a higher proportion than oxygen in a stoichiometric composition, in a manner to similar to that of the base insulating film 103 described in Embodiment 1.

The contact plugs 345a and 345b can be formed as appropriate using a material and a formation method similar to those of the contact plugs 325. Note that an electrode 353 of the transistor 349 and the wiring 335a are connected to each other through the contact plug 345a, and an electrode 355 and the wiring 335b are connected to each other through the contact plug 345b.

The insulating film 365 can be formed as appropriate using a material similar to that of the insulating film 113 in Embodiment 1.

The insulating film 367 can be formed as appropriate using a material similar to that of the insulating film 323.

In the semiconductor device of this embodiment, the transistors 305 and 306 formed using the first semiconductor material and the transistor 349 formed using the second semiconductor material are stacked, and the transistor 349 formed using the second semiconductor material is in contact with the insulating film 343 formed using the conditions similar to those of the base insulating film 103 described in Embodiment 1. Therefore, oxygen is supplied from the insulating film 343 to the oxide semiconductor film 351 by heat treatment, whereby interface states between the insulating film 343 and the oxide semiconductor film 351 can be reduced. In addition, the amount of oxygen vacancy included in the oxide semiconductor film 351 can be reduced. Furthermore, the content of water, which serves as a supply source of hydrogen, of the insulating film 343 is small. Therefore, generation of carriers in the oxide semiconductor film 351 caused by movement of water from the insulating film 343 to the oxide semiconductor film 351 can be inhibited, so that electrical characteristic variation of the transistor can be reduced.

Figure 8:
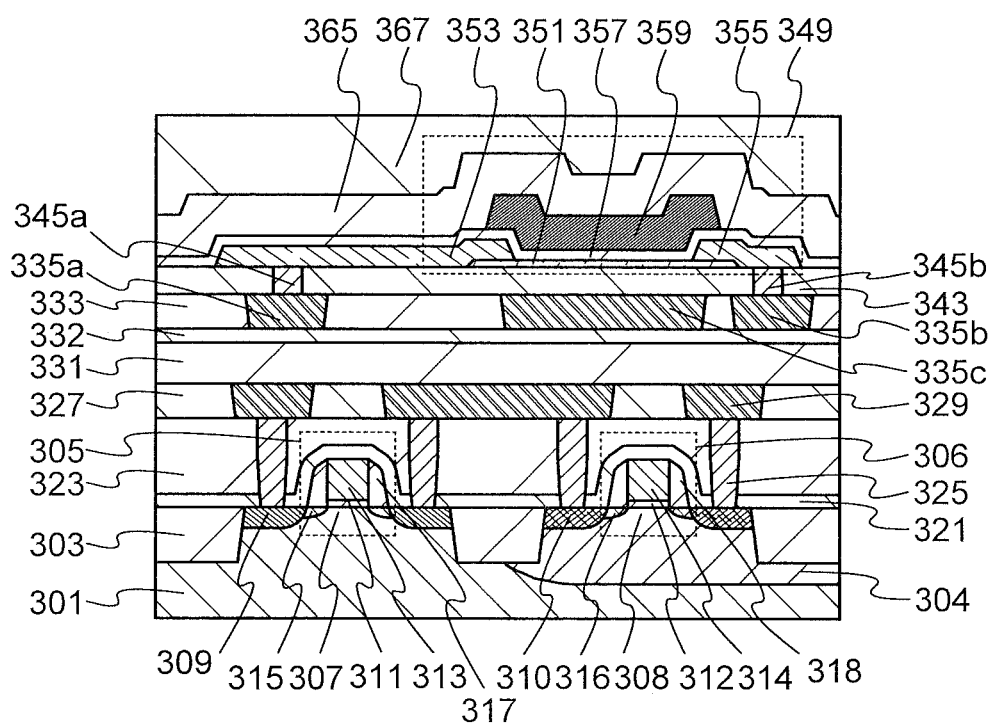
FIG. 8 is a cross-sectional view illustrating one embodiment of a semiconductor device.

Next, a method for manufacturing the semiconductor device in FIG. 8 is described with reference to FIGS. 9A to 9C.

Figure 9A:
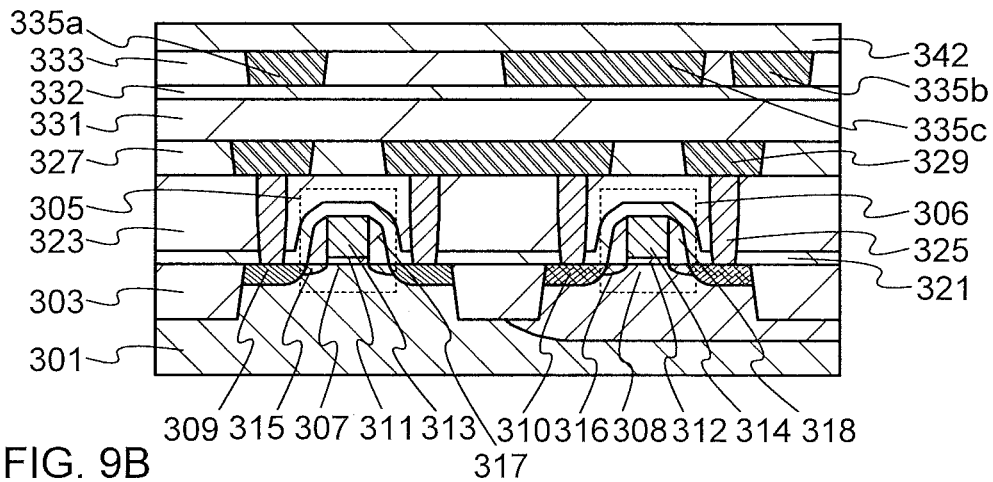
FIGS. 9A to 9C are cross-sectional views illustrating one embodiment of a method for manufacturing a semiconductor device.
Figure 9B:
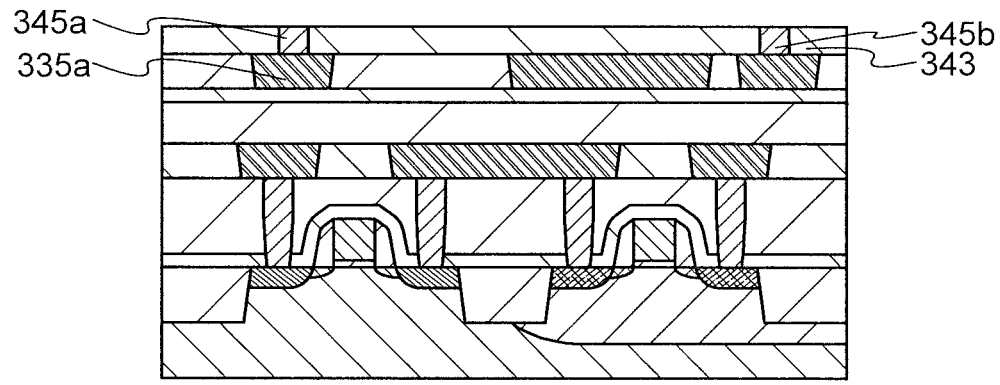

As illustrated in FIG. 9A, with use of a known method for manufacturing a MOS transistor, the transistor 305 and the transistor 306 are formed using the semiconductor substrate 301.

Next, an insulating film that is to be the insulating film 321 is formed over the transistor 305 and the transistor 306 by a sputtering method or a CVD method, and an insulating film that is to be the insulating film 323 is formed over the insulating film that is to be the insulating film 321 by a sputtering method, a CVD method, a coating method including a spin-coating method (also referred to as spin on glass: SOG), or the like. Note that the insulating film that is to be the insulating film 323 preferably has a surface that is planarized by planarization treatment such as a CMP method, or the like.

Next, openings are formed in the insulating film that is to be the insulating film 321 and the insulating film that is to be the insulating film 323, so that part of the impurity regions 309 and part of the impurity regions 310 are exposed and the insulating film 321 and the insulating film 323 are formed, and then the contact plugs 325 are formed so that the openings are filled. The contact plugs 325 can be formed in such a manner that a conductive film is formed by a sputtering method, a CVD method, an electrolytic plating method, or the like, planarization treatment is performed by a CMP method, an etching method, or the like, and then a surface portion of the conductive film, which is unnecessary, is removed.

Next, the insulating film 327 and the wirings 329 are formed over the insulating film 323.

A method for forming the insulating film 327 is described below. An insulating film that is to be the insulating film 327 is formed using a material of the insulating film 321 or the insulating film 323 as appropriate, by a sputtering method, a CVD method, a coating method including a spin-coating method, or the like. Next, part of the insulating film that is to be the insulating film 327 is removed, so that openings exposing part of the contact plugs 325 are formed, and the insulating film 327 is formed.

The wirings 329 can be formed in such a manner that a conductive film is formed over the contact plugs 325 and the insulating film 327 by a sputtering method, a CVD method, an electrolyte plating method, or the like and planarization treatment is performed by a CMP method or an etching method to divide the conductive film.

Note that by using a dual damascene method, the contact plugs 325 and the wirings 329 may be formed at the same time.

Next, the insulating film 331 is formed over the insulating film 327 and the wirings 329, and the barrier film 332 is formed over the insulating film 331. Although not shown, openings are formed in the insulating film 331 and the barrier film 332, and contact plugs with which the openings are filled are formed.

The insulating film 331 can be formed using a formation method similar to that of the insulating film 323.

The barrier film 332 can be formed by a sputtering method or a CVD method.

Next, the insulating film 333 and the wirings 335a, 335b, and 335c are formed over the barrier film 332. The insulating film 333 and the wirings 335a, 335b, and 335c can be formed in a manner similar to that of the insulating film 327 and the wirings 329.

An insulating film 342 is formed over the insulating film 333 and the wirings 335a, 335b, and 335c. The insulating film 342 is formed using conditions similar to those of the base insulating film 103 described in Embodiment 1. Note that since the water content of the insulating film 342 formed in this embodiment is small, heat treatment for releasing water from the insulating film 342 before formation of the oxide semiconductor film is not needed. Furthermore, the insulating film 342 contains oxygen at a higher proportion than oxygen in the stoichiometric composition, and thus a step for adding oxygen is not particularly necessary in addition to the step of depositing the insulating film. That is, according to this embodiment, the insulating film 342 which is capable of reducing defects at the interface with the oxide semiconductor film 351 and oxygen vacancy included in the oxide semiconductor film can be formed by a small number of steps.

Next, part of the insulating film 342 is removed to form openings, so that the insulating film 343 is formed. Then, the contact plug 345a and the contact plug 345b with which the openings are filled are faulted (see FIG. 9B).

The contact plug 345a and the contact plug 345b can be formed in a manner similar to that of the contact plugs 325.

Next, the transistor 349 is formed over the insulating film 343, the contact plug 345a, and the contact plug 345b. The transistor 349 can be formed as appropriate using a formation method described in Embodiments 1 to 6.

Figure 9C:
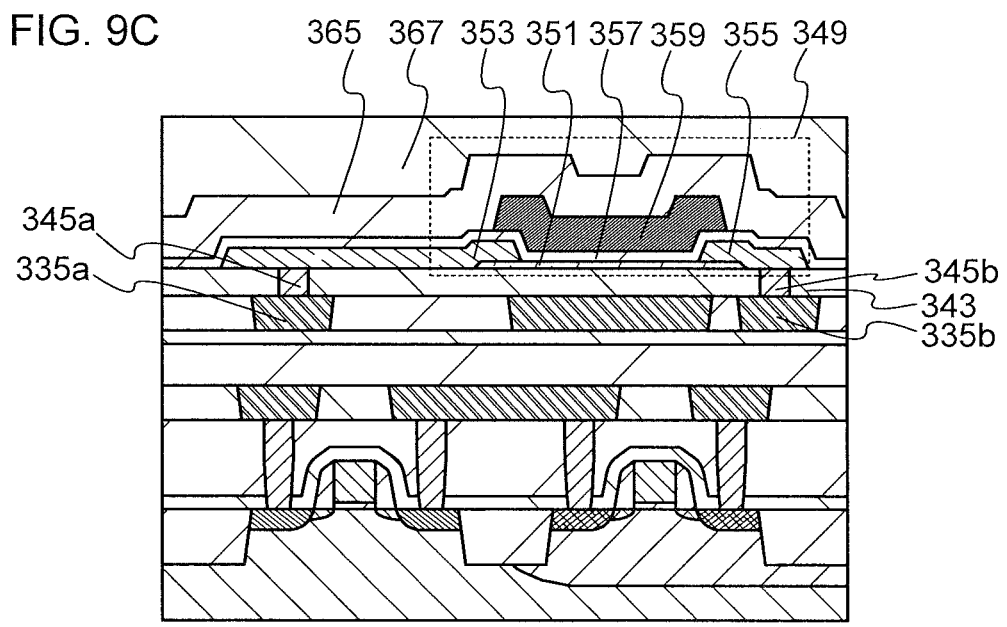

Over the transistor 349, the insulating film 365 is formed, and over the insulating film 365, the insulating film 367 is formed (see FIG. 9C).

The insulating film 365 can be formed by a sputtering method or a CVD method. The insulating film 367 can be formed by a coating method, a printing method, or the like.

As described above, through a plurality of contact plugs and a plurality of wirings, the transistor 305 or the transistor 306, which includes the first semiconductor material and is provided in the lower portion of the semiconductor device, is electrically connected to the transistor 349 which includes the second semiconductor material and is provided in the upper portion of the semiconductor device. With the above-described structure in which the transistor including the first semiconductor material and being capable of operating at high speed and the transistor including the second semiconductor material and having extremely low off-state current are combined, a semiconductor device including a logic circuit capable of operating at high speed with low power consumption, e.g., a memory device or a central processing unit (CPU), can be manufactured.

Such a semiconductor device is not limited to the above structure and can be changed as desired unless they deviate from the spirit of the present invention. For example, in the above description, two wiring layers are provided between the transistor including the first semiconductor material and the transistor including the second semiconductor material, but one wiring layer or three or more wiring layers may be provided, or without wirings, the transistors may be directly connected through only a contact plug. In this case, a through-silicon via (TSV) technique can also be used, for example. In addition, in the above description, a material such as copper is embedded in an insulating film to form a wiring, but a wiring having a three-layer structure of a barrier film, a wiring material layer, a barrier film, for example, may be obtained by patterning through a photolithography process.

In the case where a copper wiring is formed in a tier between the transistors 305 and 306 including the first semiconductor material and the transistor 349 including the second semiconductor material, it is particularly necessary to take into consideration the influence of heat treatment performed in the process for manufacturing the transistor 349 including the second semiconductor material. In other words, it is necessary to take care that the temperature of heat treatment performed in the process for manufacturing the transistor 349 including the second semiconductor material is appropriate to the properties of the wiring material. This is because, in the case where high-temperature heat treatment is performed on a component of the transistor 349 for example, thermal stress is caused in case of using the copper wiring, leading to a problem such as stress migration.

Oxygen is supplied from the insulating film 343 serving as a base insulating film to the oxide semiconductor film 351 included in the transistor 349 described in this embodiment, so that the interface states between the insulating film 343 and the oxide semiconductor film 351 and the amount of oxygen vacancy in the oxide semiconductor film 351 can be reduced. In other words, a transistor with high on-state current and excellent electric characteristics can be provided. Furthermore, the content of water, which serves as a supply source of hydrogen, of the insulating film 343 is small. Therefore, generation of carriers in the oxide semiconductor film 351 caused by movement of water from the insulating film 343 to the oxide semiconductor film 351 can be inhibited, so that a highly reliable transistor with small variation in electrical characteristics can be manufactured.

Note that the structures, methods, and the like described in this embodiment can be used as appropriate in combination with any of the structures, methods, and the like described in the other embodiments and examples.

Embodiment 6

In this embodiment, a structure of an oxide semiconductor film which is applicable to the oxide semiconductor films 105, 105a, 105b, 105c, and 351 in the transistors of Embodiments 1 to 5 is described.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like. Here, a CAAC-OS film and a microcrystalline oxide semiconductor film are described.

First, a CAAC-OS film is described.

The CAAC-OS film is one of oxide semiconductor films having a plurality of crystal parts. The crystal parts included in the CAAC-OS film each have c-axis alignment. In a plan TEM image, the area of the crystal parts included in the CAAC-OS film is greater than or equal to 2500 nm$^2$, greater than or equal to 5 µm$^2$, or greater than or equal to 1000 µm$^2$. Further, in a cross-sectional TEM image, when the proportion of the crystal parts is greater than or equal to 50%, greater than or equal to 80%, or greater than or equal to 95% of the CAAC-OS film, the CAAC-OS film is a thin film having physical properties similar to those of a single crystal.

In a transmission electron microscope (TEM) image of the CAAC-OS film, it is difficult to clearly observe a boundary between crystal parts, that is, a grain boundary. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (00x) plane (x is an integral number) of the InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal part is aligned with a direction parallel to a normal vector of a formation surface or a normal vector of a top surface. Thus, for example, in the case where a shape of the CAAC-OS film is changed by etching or the like, the c-axis of the crystal part might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the amount of oxygen vacancy is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has small variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, it may be difficult to clearly found crystal parts in the microcrystalline oxide semiconductor. In most cases, a crystal part in the microcrystalline oxide-semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, it may be difficult to clearly detect a boundary between crystal parts.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

Figure 10:
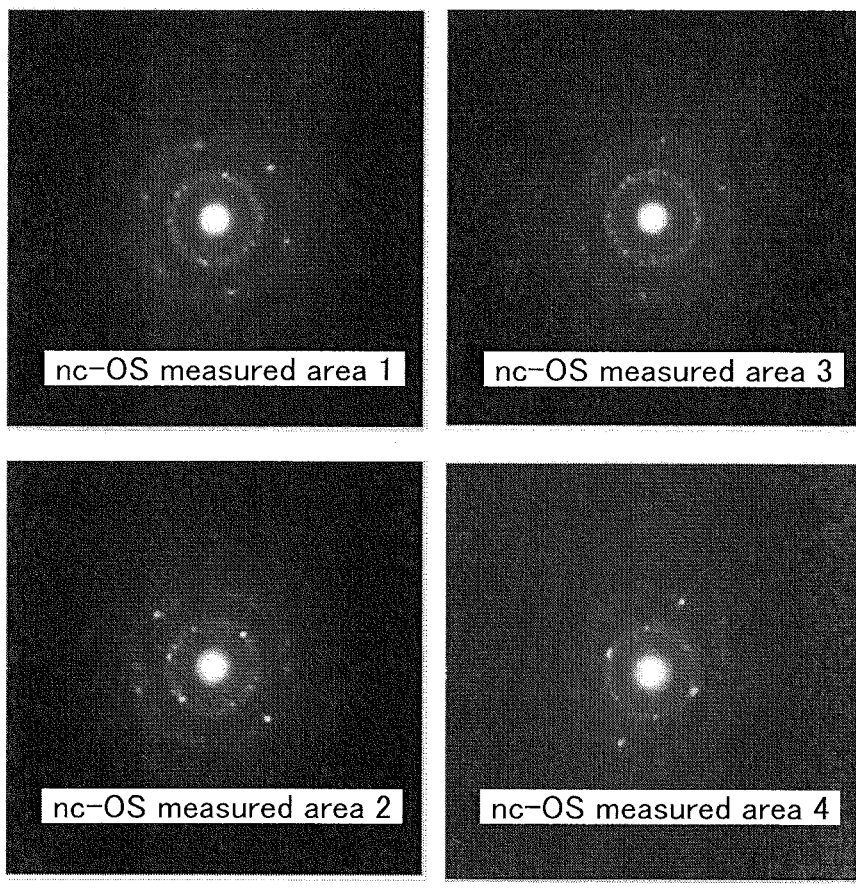
FIG. 10 shows an nc-OS film.

FIG. 10 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 10 shows that, when a nanobeam electron diffraction is performed on the sample including the nc-OS film, a diffraction pattern exhibiting a crystal plane is obtained, but orientation along a crystal plane in a particular direction is not observed.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. However, there is no regularity of crystal orientation between different crystal parts in the nc-OS film; hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

Embodiment 7

As examples of the semiconductor device described in any of the above embodiments, a central processing unit, a microprocessor, a microcomputer, a memory device, an image sensor, an electro-optical device, a light-emitting display device, and the like can be given. The semiconductor device can be applied to a variety of electronic devices. Examples of the electronic devices are as follows: display devices, lighting devices, personal computers, word processors, image reproducing devices, portable compact disc (CD) players, radio receivers, tape recorders, headphone stereos, stereos, clocks, cordless phone handsets, transceivers, portable wireless devices, mobile phones, smart phones, electronic books, car phones, portable game machines, calculators, portable information terminals, e-book readers, electronic translators, audio input devices, cameras such as video cameras or digital still cameras, toys, electric shavers, high-frequency heating appliances, electric rice cookers, electric washing machines, electric vacuum cleaners, water heaters, electric fans, hair dryers, air conditioners, humidifiers, dehumidifiers, air-conditioning systems, dishwashing machines, dish drying machines, clothes dryers, futon dryers, electric refrigerators, electric freezers, electric refrigerator-freezers, freezers for preserving DNA, flashlights, electric power tools, smoke detectors, medical equipment, guide lights, traffic lights, belt conveyors, elevators, escalators, industrial robots, power storage systems, electric vehicles, hybrid electric vehicles, plug-in hybrid electric vehicles, tracked vehicles, motorized bicycles, motorcycles, electric wheelchairs, golf carts, boats, ships, submarines, helicopters, aircrafts, rockets, artificial satellites, space probes, planetary probes, and spacecrafts. In this embodiment, examples of application of the semiconductor device described in any of the above embodiments to portable devices such as mobile phones, smartphones, or e-book readers are described with reference to FIGS. 11A and 11B, FIG. 12, FIG. 13, and FIG. 14.

In portable electronic devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 11A:
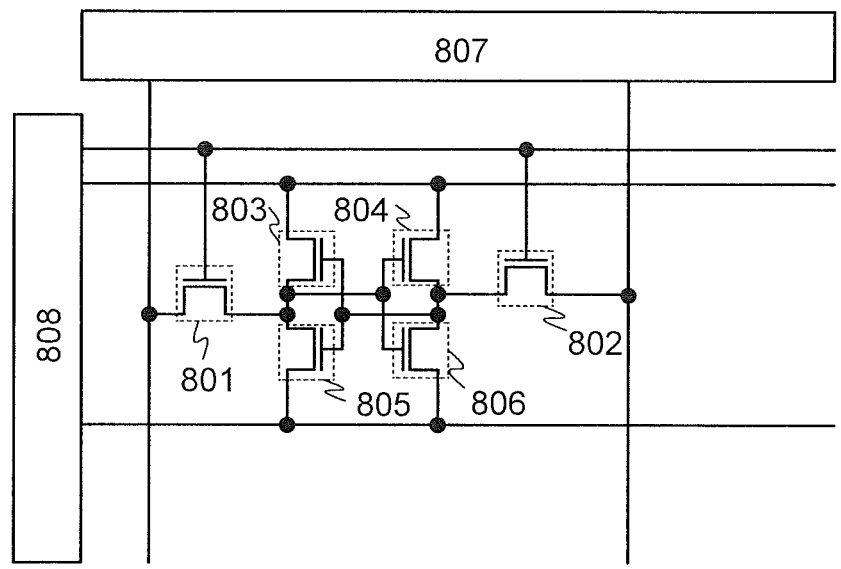
FIGS. 11A and 11B are circuit diagrams each illustrating one embodiment of a semiconductor device.

In an ordinary SRAM, as illustrated in FIG. 11A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Thus, a price per bit of an SRAM is the most expensive among a variety of memory devices.

Figure 11B:
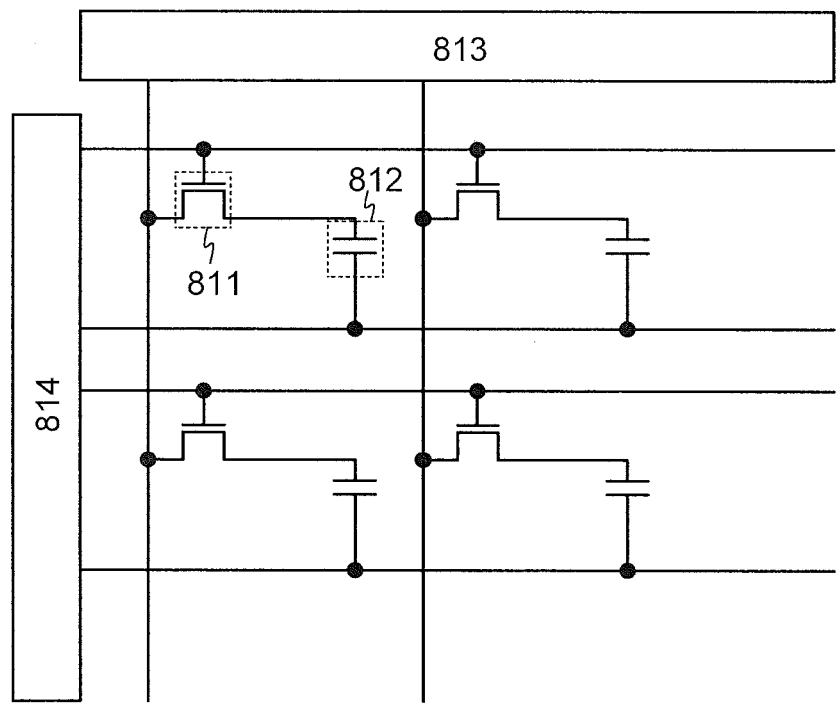

On the other hand, as illustrated in FIG. 11B, a memory cell in a DRAM includes a transistor 811 and a storage capacitor 812, which are driven by an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, with use of the transistor with low off-state current, which is described in the above embodiment, for the transistor 811, electric charge in the storage capacitor 812 can be held for a long time, and thus it is not necessary to perform refresh operation frequently. Accordingly, power consumption can be reduced.

Figure 12:
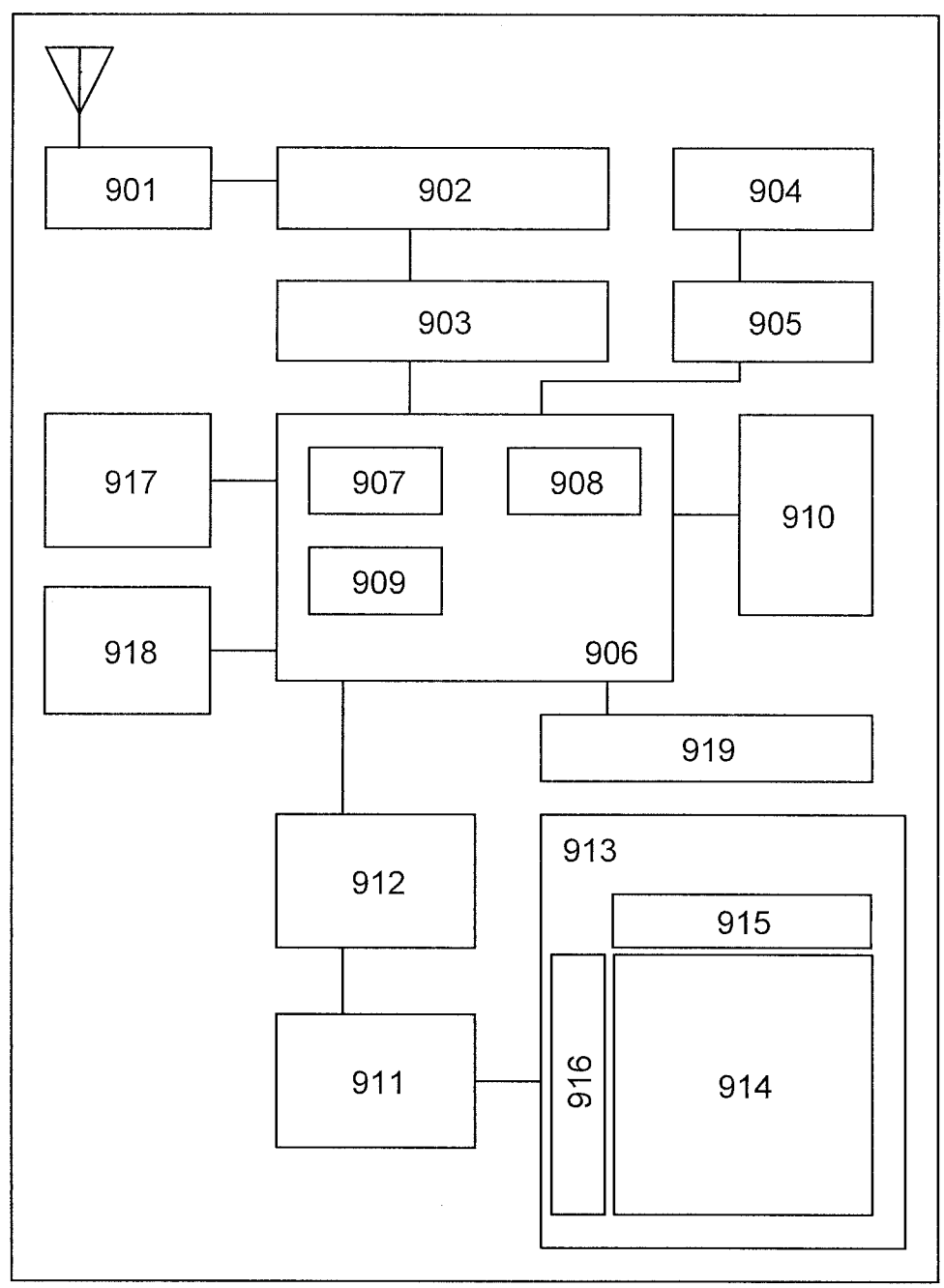
FIG. 12 is a block diagram illustrating one embodiment of a semiconductor device.

FIG. 12 is a block diagram of a portable device. The portable device illustrated in FIG. 12 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a central processing unit (CPU) 907, a DSP 908, and an interface (IF) 909. In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced. Further, the power consumption of the CPU 907 can be sufficiently reduced by employing the semiconductor device described in any of the above embodiments for a main memory device for storing data or an instruction or a buffer memory device capable of high-speed writing and reading of data, such as a register or a cache, which is included in the CPU.

Figure 13:
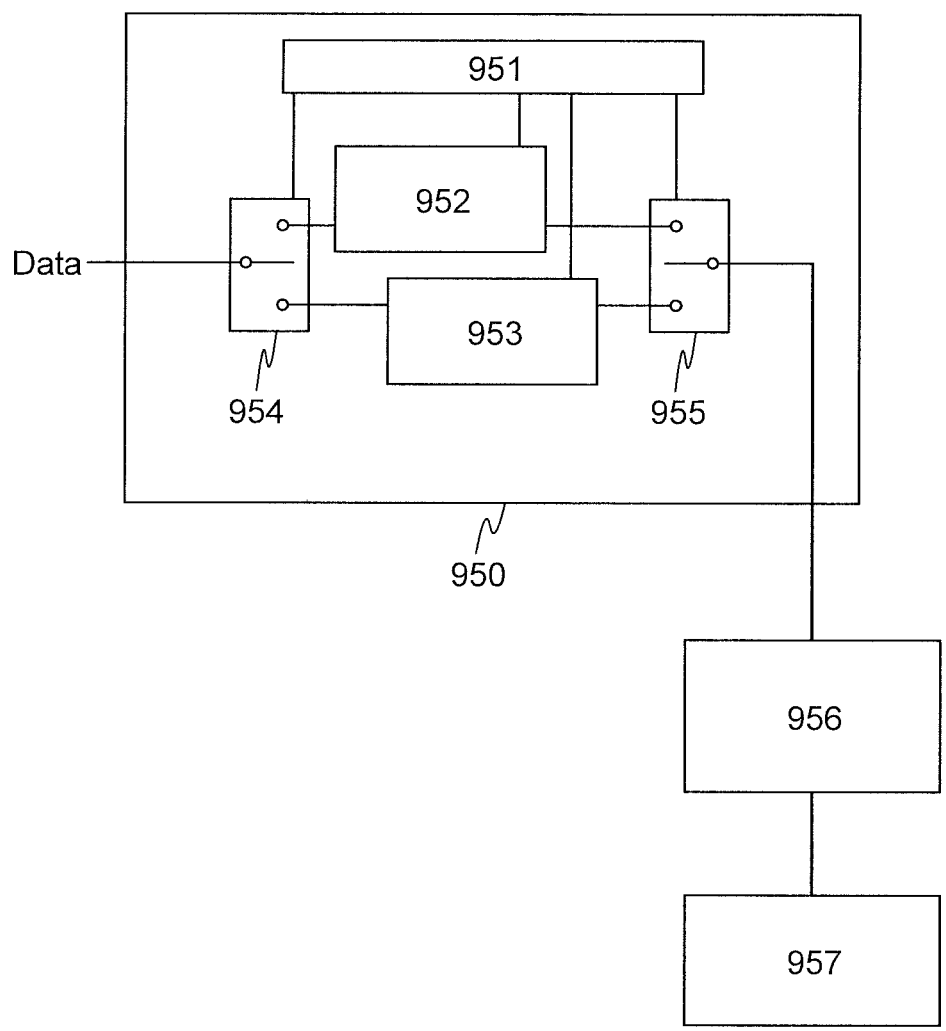
FIG. 13 is a block diagram illustrating one embodiment of a semiconductor device.

FIG. 13 illustrates an example of using the semiconductor device described in any of the above embodiments in a memory circuit 950 for a display. The memory circuit 950 illustrated in FIG. 13 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 through the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced.

Figure 14:
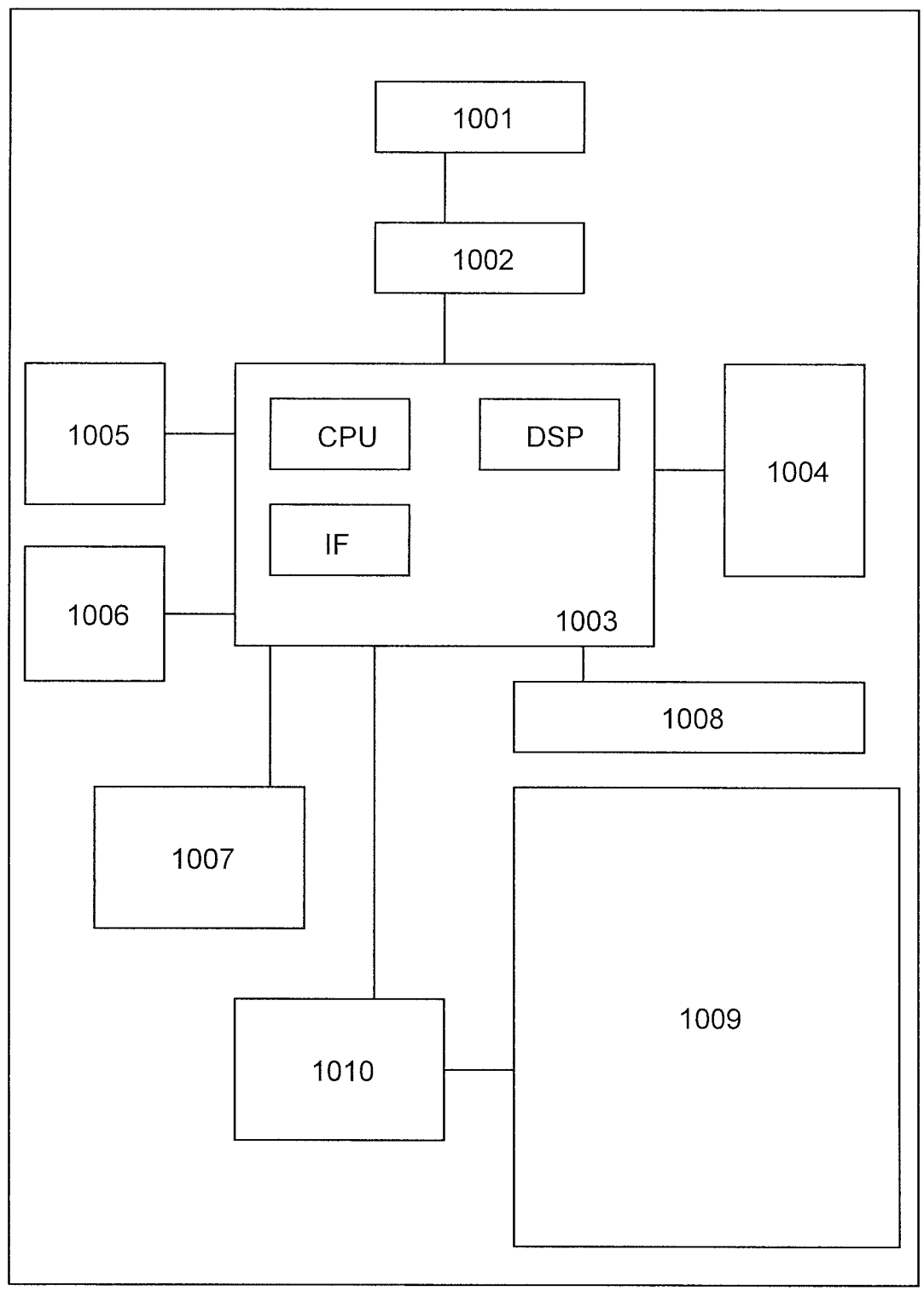
FIG. 14 is a block diagram illustrating one embodiment of a semiconductor device.

FIG. 14 is a block diagram of an e-book reader. The electronic book in FIG. 14 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 14. The memory circuit 1007 has a function of temporarily holding the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced can be obtained.

The structures, methods, and the like described in this embodiment can be combined as appropriate with any of the structures, methods, and the like described in the other embodiments.

EXAMPLE 1

In this example, evaluation results of a silicon oxynitride film which is formed by a CVD method and is applicable to a base insulating film of one embodiment of the present invention are described. Specifically, evaluation results of the amount of oxygen molecules and the amount of nitrogen monoxide which are released by heating are described.

First, a method for forming the evaluated samples is described. The formed samples are Samples 1 to 4.

Samples 1 to 4 were each formed in such a manner that a 100-nm-thick silicon oxynitride film was formed over a silicon wafer by a plasma CVD method under conditions for forming the base insulating film 103 described in Embodiment 1 or under comparative conditions.

Deposition conditions of the silicon oxynitride film of Sample 1 are described below. The silicon oxynitride film was formed in such a manner that a silicon wafer was installed in a treatment chamber of a plasma CVD apparatus, silane at a flow rate of 2 sccm and dinitrogen monoxide at a flow rate of 4000 sccm were supplied as a source gas to the treatment chamber, the pressure in the treatment chamber was controlled to 700 Pa, a power of 250 W was supplied to one of parallel plate electrodes at a high-frequency power source of 60 MHz, and power was not supplied to the other of the parallel plate electrodes (on the substrate side). Note that the flow rate ratio of dinitrogen monoxide to silane is 2000. The substrate temperature was 350° C. Furthermore, the parallel plate electrodes of the plasma CVD apparatus have an area of 405 cm$^2$, and thus, the power density of the power supplied to the electrode is 0.62 W/cm$^2$.

The silicon oxynitride film of Sample 2 was deposited under the conditions of Sample 1 where the substrate temperature was 400° C.

The silicon oxynitride film of Sample 3 was a silicon oxynitride film from which oxygen is released by heating and was formed in such a manner that a silicon oxynitride film from which oxygen is not released by heating was formed by a CVD method and was doped with oxygen. Note that the thickness of the silicon oxynitride film was 300 nm.

Here, the silicon oxynitride film was formed in such a manner that a silicon wafer was installed in a treatment chamber of a plasma CVD apparatus, silane at a flow rate of 2.3 sccm and dinitrogen monoxide at a flow rate of 800 sccm were supplied as a source gas to the treatment chamber, the pressure in the treatment chamber was controlled to 40 Pa, a power of 50 W was supplied to one of parallel plate electrodes at a high-frequency power source of 27.12 MHz, and power was not supplied to the other of the parallel plate electrodes (on the substrate side). Note that the flow rate ratio of dinitrogen monoxide to silane is 348. The substrate temperature was 400° C. Furthermore, the parallel plate electrodes of the plasma CVD apparatus have an area of 615 cm$^2$, and thus, the power density of the power supplied to the electrode is 0.08 W/cm$^2$. Then, heat treatment was performed in a vacuum atmosphere at 450° C. for one hour, and then the silicon oxynitride film was doped with oxygen ions at a dosage of 2×10$^{16}$ ions/cm$^2$, whereby a silicon oxynitride film from which oxygen was released by heating was formed.

Deposition conditions of the silicon oxynitride film of Sample 4 are described below. The silicon oxynitride film was formed in such a manner that a silicon wafer was installed in a treatment chamber of a plasma CVD apparatus, silane at a flow rates of 2 sccm, argon at a flow rate of 3000 sccm, and dinitrogen monoxide at a flow rate of 1000 sccm were supplied as a source gas to the treatment chamber, the pressure in the treatment chamber was controlled to 700 Pa, a power of 250 W was supplied to one of parallel plate electrodes at a high-frequency power source of 60 MHz, and power was not supplied to the other of the parallel plate electrodes (on the substrate side). Note that the flow rate ratio of dinitrogen monoxide to silane is 500. The substrate temperature was 350° C. Furthermore, the parallel plate electrodes of the plasma CVD apparatus have an area of 405 cm$^2$, and thus, the power density of the power supplied to the electrode is 0.62 W/cm$^2$. Note that for the deposition conditions of Sample 4, argon is included in addition to the source gas. Argon promotes decomposition of the source gas by plasma. As a result, bonds of silicon and oxygen are increased to reduce the amount of oxygen released by heating.

Next, TDS analyses were performed on Samples 1 to 4. Here, TDS analysis was performed in such a manner that Samples 1 to 4 were set at a stage formed of black quartz and the stage is heated from 50° C. to 950° C. (the substrate of each sample was heated from 46° C. to 530° C.). Table 1 shows the amount of molecules which are released to the outside and the amount of oxygen atoms derived from oxygen molecules and nitrogen monoxide (i.e., the total of the amount of released nitrogen monoxide and double of the amount of released oxygen molecules) which are released to the outside. Note that the amount of each of the gases is estimated from the integral value of a peak of a curve showing the result of TDS analysis.

TABLE 1

|  |  | Sample 1 | Sample 2 | Sample 3 | Sample 4 |
|---|---|---|---|---|---|
| The amount of released O$_2$ | (/cm$^3$) | 1.8E+20 | 1.1E+20 | 5.7E+20 | 2.4E+19 |
| The amount of released oxygen atoms derived from O$_2$ and NO (the amount of O$_2$ × 2 + the amount of released NO) | (/cm$^3$) | 4.4E+20 | 2.8E+20 | 6.0E+20 | 6.1E+19 |
| The amount of released oxygen atoms derived from O$_2$ and NO (the amount of O$_2$ × 2 + the amount of released NO) | (/cm$^2$) | 1.3E+16 | 8.3E+15 | 1.8E+16 | 1.8E+15 |

Table 1 shows that the amount of released oxygen atoms derived from oxygen molecules and nitrogen monoxide which are released from each of Samples 1 to 3 is greater than or equal to 5×10$^{15}$/cm$^2$ and less than or equal to 5×10$^{16}$/cm$^2$. Since the thickness of the silicon oxynitride film was 100 nm, the amount of released oxygen atoms derived from oxygen molecules and nitrogen monoxide was greater than or equal to 1×10$^{20}$/cm$^3$ and less than or equal to 1×10$^{21}$/cm$^3$.

Next, the electrical characteristics of transistors each including an oxide semiconductor film, in which the silicon oxynitride films of Samples 1 to 4 are used as base insulating films, are described.

First, steps of forming each transistor are described. Description in this example is made with reference to FIGS. 4A to 4D and FIGS. 5A to 5C.

As illustrated in FIG. 4A, the base insulating film 103 was formed over the substrate 101. Then, the oxide semiconductor films 104a and 104b were formed over the base insulating film 103.

A silicon wafer was used as the substrate 101.

The substrate 101 was heated at 950° C. in an oxygen atmosphere containing hydrogen chloride, so that a 100-nm-thick silicon oxide film containing chlorine was formed on the surface of the substrate 101. Next, a 300-nm-thick silicon oxynitride film was formed over the silicon oxide film containing chlorine by a CVD method. Note that samples in which the silicon oxynitride films were formed under conditions of Sample 1, Sample 2, Sample 3, and Sample 4 are referred to as Sample 5, Sample 6, Sample 7, and Sample 8, respectively. Next, the surface of the silicon oxynitride was subjected to CMP treatment so that the surface of the silicon oxynitride film was polished by approximately 20 nm in thickness. Through the above process, the base insulating film 103 formed of a stack including the silicon oxide film containing choline and the silicon oxynitride film was formed.

A 20-nm-thick In—Ga—Zn-based oxide film was formed as the oxide semiconductor film 104a by a sputtering method. As for sputtering conditions at this time, a target of In:Ga:Zn=1:3:2 was used; argon at a flow rate of 30 sccm and oxygen at a flow rate of 15 sccm were introduced as a sputtering gas into a treatment chamber having a pressure of 0.4 Pa; the substrate temperature was 200° C.; and the supplied electric power was 0.5 kW.

A 15-nm-thick In—Ga—Zn-based oxide film was formed as the oxide semiconductor film 104b by a sputtering method. As for sputtering conditions at this time, a target of In:Ga:Zn=1:1:1 was used; argon at a flow rate of 30 sccm and oxygen at flow rate of 15 sccm were introduced as a sputtering gas into a treatment chamber having a pressure of 0.4 Pa; the substrate temperature was 300° C.; and the supplied electric power was 0.5 kW.

Next, oxygen was moved from the base insulating film 103 to the In—Ga—Zn-based oxide film by heat treatment to reduce oxygen vacancy. The conditions of the heat treatment at that time were as follows: heating was performed at a nitrogen atmosphere in a treatment chamber at 450° C. for one hour, and then heating was performed in an oxygen atmosphere for one hour.

Next, a mask was formed over the oxide semiconductor film through a photolithography process and then the oxide semiconductor film was selectively etched; thus, as illustrated in FIG. 4B, the oxide semiconductor films 105a and 105b (hereinafter collectively referred to as the oxide semiconductor film 105) were formed. Here, an ICP etching apparatus was used for the etching. As for etching conditions, a power of 450 W was supplied to an ICP electrode; a power of 100 W was supplied to a bias electrode; the pressure in a treatment chamber was 1.9 Pa; and boron trichloride at a flow rate of 60 sccm and chlorine at a flow rate of 20 sccm were used as an etching gas. After that, the mask is removed.

Next, as illustrated in FIG. 4C, the pair of electrodes 116 was formed over the oxide semiconductor film 105. Here, the pair of electrodes 116 were formed in such a manner that a 100-nm-thick tungsten film was formed over the oxide semiconductor film 105 by a sputtering method, a mask was formed over the tungsten film in a photolithography step, and then the tungsten film was selectively etched. After that, the mask is removed.

As for sputtering conditions for forming the tungsten film, a tungsten target was used; heated argon at a flow rate of 80 sccm was introduced as a sputtering gas into a treatment chamber having a pressure of 0.8 Pa; the substrate temperature was 200° C.; and the supplied electric power was 1 kW.

First etching was performed on the tungsten film under the conditions where a power of 3000 W was supplied to an ICP electrode; a power of 110 W was supplied to a bias electrode; the pressure of the treatment chamber was 0.67 Pa; and chlorine at a flow rate of 45 sccm, carbon tetrachloride at a flow rate of 55 sccm, and oxygen at a flow rate of 55 sccm were used as an etching gas. Next, the power of the bias electrode was set to 0 W; instead of the etching gas, oxygen was introduced to the treatment chamber; a resist was reduced in size by ashing treatment; and then second etching was performed under the same conditions as the first etching.

After that, as illustrated in FIG. 4D, the oxide semiconductor film 104c and the gate insulating film 108 were formed over the oxide semiconductor film 105 and the pair of electrodes 116.

A 5-nm-thick In—Ga—Zn-based oxide film was formed as the oxide semiconductor film 104c under conditions similar to those of the oxide semiconductor film 104a.

Here, as the gate insulating film 108, a 20-nm-thick silicon oxynitride film was formed by a CVD method. As for deposition conditions by a plasma CVD method at this time, silane at a flow rate of 1 sccm and dinitrogen monoxide at a flow rate of 800 sccm were introduced as a source gas into a treatment chamber having a pressure of 40 Pa; the power of 60 MHz high-frequency power supply was 150 W; the substrate temperature was 350° C.; and the distance between electrodes was 28 mm.

Then, as illustrated in FIG. 5A, the gate electrode 111 was formed over the gate insulating film 108.

The gate electrode 111 was formed in such a manner that a 30-nm-thick titanium nitride film and a 135-nm-thick tungsten film were stacked over the gate insulating film 108 by a sputtering method, a mask was formed over the tungsten film by a photolithography process, and then the titanium nitride film and the tungsten film were selectively etched.

As for sputtering conditions for forming the titanium nitride film, a titanium target was used; nitrogen at a flow rate of 50 sccm was introduced as a sputtering gas into a treatment chamber having a pressure of 0.2 Pa; the substrate temperature was 25° C.; and the supplied electric power was 12 kW. As for sputtering conditions for forming the tungsten film, a tungsten target was used; heated argon at a flow rate of 100 sccm was introduced as a sputtering gas into a treatment chamber having a pressure of 2 Pa; the substrate temperature was 200° C.; and the supplied electric power was 4 kW.

First etching was performed on the tungsten film and the titanium nitride film under the conditions where a power of 3000 W was supplied to an ICP electrode; a power of 110 W was supplied to a bias electrode; the pressure of the treatment chamber was 0.67 Pa; and chlorine at a flow rate of 45 sccm, carbon tetrafluoride at a flow rate of 55 sccm, and oxygen at a flow rate of 55 sccm were used as an etching gas. Then, second etching was performed under conditions where a power of 2000 W was supplied to the ICP electrode; a power of 50 W was supplied to the bias electrode; the pressure of the treatment chamber was 0.67 Pa; and chlorine at a flow rate of 100 sccm was used as an etching gas.

After that, doping with phosphorus was performed so that a peak of a concentration profile appears in the vicinity of the base insulating film 117 and the oxide semiconductor film 105a. Here, the base insulating film 117 and the oxide semiconductor film 105a were doped with phosphorus at a dosage of $1\times10^{15}$ ions/cm$^2$. When the base insulating film 117 is doped with phosphorus, oxygen and phosphorus react with each other in the vicinity of the surface of the base insulating film 117. A product obtained as a result of the reaction inhibits release of oxygen from the surface of the base insulating film 117. Therefore, excess oxygen contained in the base insulating film 117 is moved to a region which is not doped with phosphorus, that is, the vicinity of a region of the oxide semiconductor film 105a over which the gate electrode 111 is positioned. As a result, oxygen vacancy of the oxide semiconductor film 105a can be reduced.

Then, as illustrated in FIG. 5B, the oxide semiconductor film 105c and the gate insulating film 109a were formed.

Here, the oxide semiconductor film 105c and the gate insulating film 109a were formed in such a manner that a power of 450 W was supplied to an ICP electrode; a power of 100 W was supplied to a bias electrode; the pressure in a treatment chamber was 1 Pa; and boron chloride at a flow rate of 80 sccm was used as an etching gas.

Next, as illustrated in FIG. 5C, the insulating films 118 and 119 and the wirings 115 were formed.

Here, a 70-nm-thick aluminum oxide film and a 300-nm-thick silicon oxynitride film were stacked, and then insulating films to be the insulating films 118 and 119 were formed.

Next, heat treatment was performed in an oxygen atmosphere at 400° C. for an hour.

After that, a mask was formed over the insulating film through a photolithography process, and the aluminum oxide film and the silicon oxynitride film were selectively etched, so that openings and the insulating films 118 and 119 were formed.

The wirings 115 were formed in such a manner that a 50-nm-thick titanium film, a 200-nm-thick aluminum film, and a 50-nm-thick titanium film were stacked in this order, a mask was formed by a photolithography process, and the films were selectively etched with the use of the mask. After that, the mask is removed.

As for sputtering conditions for forming the titanium films, a titanium target was used; argon at a flow rate of 20 sccm was introduced as a sputtering gas into a treatment chamber having a pressure of 0.1 Pa; the substrate temperature was room temperature; and the supplied electric power was 12 kW. As for sputtering conditions for forming the aluminum film, an aluminum target was used; argon at a flow rate of 50 sccm was introduced as a sputtering gas into a treatment chamber having a pressure of 0.4 Pa; the substrate temperature was room temperature; and the supplied electric power was 1 kW.

First etching was performed on the titanium film, the aluminum film, and the titanium film under the conditions where a power of 450 W was supplied to an ICP electrode; a power of 100 W was supplied to a bias electrode; the pressure of the treatment chamber was 1.9 Pa; and boron trichloride at a flow rate of 60 sccm and chlorine at a flow rate of 20 sccm were used as etching gases. Then, second etching was performed under conditions where a power of 500 W was supplied to the ICP electrode; a power of 50 W was supplied to the bias electrode; the pressure of the treatment chamber was 2.0 Pa; and carbon tetrafluoride at a flow rate of 80 sccm was used as an etching gas.

Then, a composition was applied to the insulating film 119 and the wirings 115; light exposure was performed; development was conducted; the wirings 115 were exposed; and then heat treatment was performed, whereby an insulating film formed of polyimide was formed.

Through the above-described steps, each transistor was formed.

Next, the electrical characteristics of Samples 5 to 8 were measured. Here, a change in characteristics of the source-drain current (hereinafter, referred to as the drain current), that is, current versus voltage characteristics were measured under the conditions where the voltages between the source and the drain (hereinafter, referred to as the drain voltage) were 0.1 V and 3.0 V, and the voltage between the source and the gate (hereinafter, referred to as the gate voltage) was changed from −3 V to +3 V. FIGS. 15A and 15B and FIGS. 16A and 16B show current versus voltage characteristics of the measurement. Note that the horizontal axis represents gate voltage and the vertical axis represents drain current in FIGS. 15A and 15B and FIGS. 16A and 16B. The channel length and the channel width of the transistor were 0.49 μm and 10 μm, respectively.

Figure 15A:
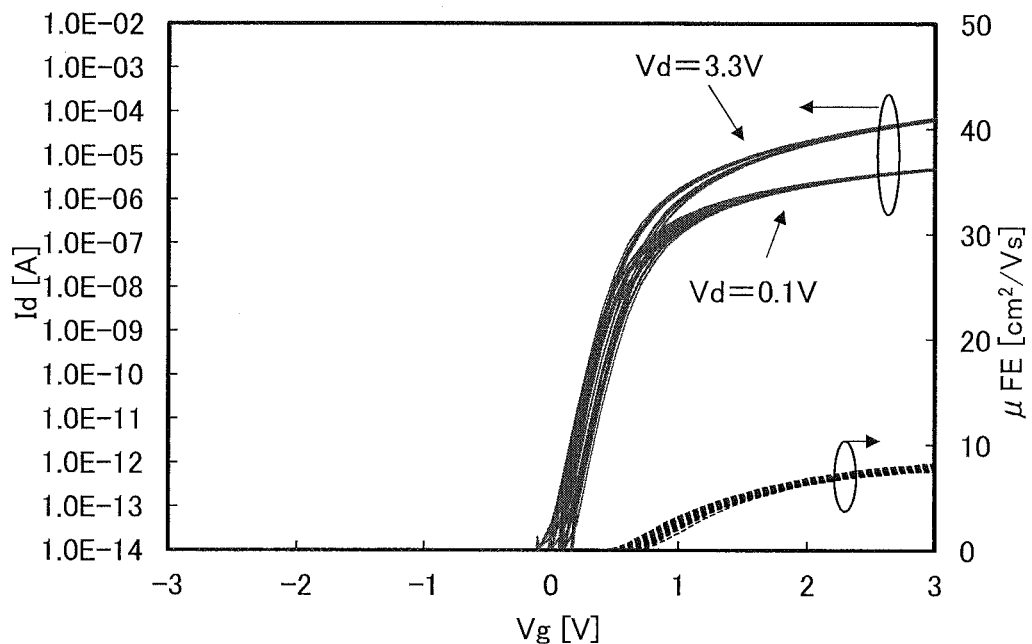
FIGS. 15A and 15B are graphs showing electrical characteristics of a transistor.

A solid ling in FIG. 15A denotes the current versus voltage characteristics of Sample 5. A solid line in FIG. 15B denotes the current versus voltage characteristics of Sample 6. A solid line in FIG. 16A denotes the current versus voltage characteristics of Sample 7. A solid line in FIG. 16B denotes the current versus voltage characteristics of Sample 8. Note that each dotted line in FIGS. 15A and 15B and FIGS. 16A and 16B denotes field-effect mobility.

Table 2 shows the on-state current (Ion) at a gate voltage Vg of 3 V and a drain voltage Vd of 3.3 V, the threshold voltage (Vth) at a drain voltage Vd of 3.3 V, the field-effect mobility (μFE) at a drain voltage Vd of 0.1 V, and the subthreshold swing value (S value) at a drain voltage Vd of 0.1 V in each of Samples 5 to 8.

TABLE 2

| | | Sample 5 | Sample 6 | Sample 7 | Sample 8 |
|---|---|---|---|---|---|
| Ion (Vd = 3.3 V, Vg = 3 V) | [μA] | 65.9 | 73.7 | 83.8 | 158.4 |
| μFE (Vd = 0.1 V) | [cm$^2$/Vs] | 7.9 | 8.3 | 9.0 | 9.4 |
| S value (Vd = 0.1 V) | [mV/dec.] | 78.2 | 78.1 | 74.6 | 121.47 |
| Vth (Vd = 3.3 V) | [V] | 0.8 | 0.8 | 0.7 | −0.5 |

Figure 15B:
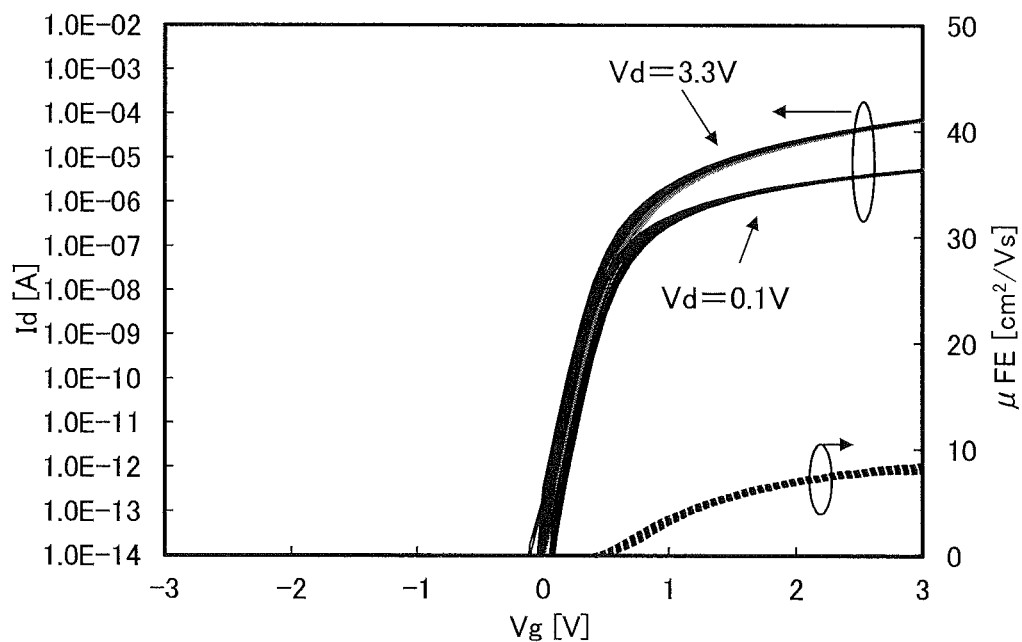
Figure 16A:
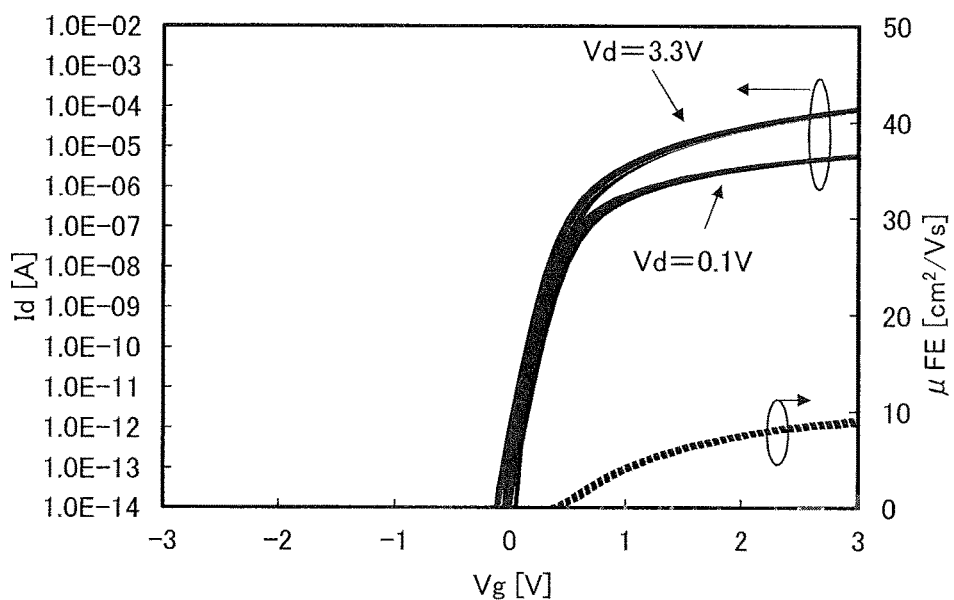
FIGS. 16A and 16B are graphs showing electrical characteristics of a transistor.
Figure 16B:
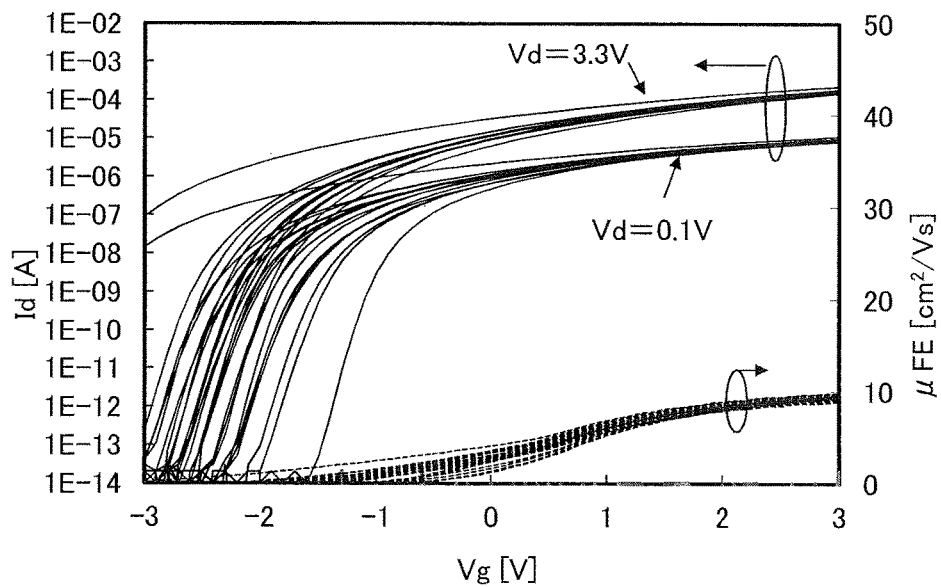

FIGS. 15A and 15B and FIG. 16A show that the current versus voltage characteristics of the transistors in which the silicon oxynitride films of Samples 1 to 3 are used as the base insulating films exhibit switching characteristics. On the other hand, the transistor in which the silicon oxynitride film of Sample 4 is used as the base insulating film does not have switching characteristics. The above facts indicate that when a silicon oxynitride film is used as a base insulating film of a transistor including an oxide semiconductor film and oxygen atoms derived from oxygen molecules and nitrogen monoxide which are released from the silicon oxynitride film is greater than or equal to $5 \times 10^{15}/cm^2$ or and less than or equal to $5 \times 10^{16}/cm^2$, the transistor can have excellent characteristics. Further, it is found that when a silicon oxynitride film is used as a base insulating film of a transistor including an oxide semiconductor film and oxygen atoms derived from oxygen molecules and nitrogen monoxide which are released from the silicon oxynitride film is greater than or equal to $1 \times 10^{20}/cm^3$ or and less than or equal to $1 \times 10^{21}/cm^3$, the transistor can have excellent characteristics.

This application is based on Japanese Patent Application serial No. 2013-094550 filed with Japan Patent Office on Apr. 26, 2013, the entire contents of which are hereby incorporated by reference.

What is claimed is:

1. A semiconductor device comprising:
   an oxynitride insulating film;
   an oxide semiconductor film over and in contact with the oxynitride insulating film;
   a pair of electrodes in contact with the oxide semiconductor film;
   a gate insulating film in contact with the oxide semiconductor film; and
   a gate electrode overlapping the oxide semiconductor film,
   wherein a total of an amount of a gas having a mass-to-charge ratio of 30 released from the oxynitride insulating film by heat treatment and double of an amount of a gas having a mass-to-charge ratio of 32 released from the oxynitride insulating film by heat treatment is greater than or equal to $5\times10^{15}/\text{cm}^2$ and less than or equal to $5\times10^{16}/\text{cm}^2$, wherein the gas having a mass-to-charge ratio of 30 is nitrogen monoxide, and wherein the gas having a mass-to-charge ratio of 32 is oxygen.

2. The semiconductor device according to claim 1, wherein the oxynitride insulating film contains oxygen at a higher proportion than oxygen in a stoichiometric composition.

3. The semiconductor device according to claim 1, wherein the oxynitride insulating film contains oxygen at a higher proportion than nitrogen.

4. The semiconductor device according to claim 1, wherein a thickness of oxynitride insulating film is greater than or equal to 100 nm and less than or equal to 3000 nm.

5. The semiconductor device according to claim 1, wherein the total of an amount of the gas having the mass-to-charge ratio of 30 released from the oxynitride insulating film by the heat treatment and double of the amount of the gas having the mass-to-charge ratio of 32 released from the oxynitride insulating film by the heat treatment is measured by thermal desorption spectroscopy.

6. The semiconductor device according to claim 1, wherein a thickness of the oxide semiconductor film is greater than or equal to 3 nm and less than or equal to 200 nm.

7. The semiconductor device according to claim 1, wherein a thickness of the gate insulating film is greater than or equal to 5 nm and less than or equal to 400 nm.

8. A semiconductor device comprising:
an oxynitride insulating film;
an oxide semiconductor film over and in contact with the oxynitride insulating film;
a pair of electrodes in contact with the oxide semiconductor film;
a gate insulating film in contact with the oxide semiconductor film; and
a gate electrode overlapping the oxide semiconductor film, wherein a total of an amount of a gas having a mass-to-charge ratio of 30 released from the oxynitride insulating film by heat treatment and double of an amount of a gas having a mass-to-charge ratio of 32 released from the oxynitride insulating film by heat treatment is greater than or equal to $1\times10^{20}/\text{cm}^3$ and less than or equal to $1\times10^{21}/\text{cm}^3$, wherein the gas having a mass-to-charge ratio of 30 is nitrogen monoxide, and wherein the gas having a mass-to-charge ratio of 32 is oxygen.

9. The semiconductor device according to claim 8, wherein the oxynitride insulating film contains oxygen at a higher proportion than oxygen in a stoichiometric composition.

10. The semiconductor device according to claim 8, wherein the oxynitride insulating film contains oxygen at a higher proportion than nitrogen.

11. The semiconductor device according to claim 8, wherein a thickness of oxynitride insulating film is greater than or equal to 100 nm and less than or equal to 3000 nm.

12. The semiconductor device according to claim 8, wherein the total of an amount of the gas having the mass-to-charge ratio of 30 released from the oxynitride insulating film by the heat treatment and double of the amount of the gas having the mass-to-charge ratio of 32 released from the oxynitride insulating film by the heat treatment is measured by thermal desorption spectroscopy.

13. The semiconductor device according to claim 8, wherein a thickness of the oxide semiconductor film is greater than or equal to 3 nm and less than or equal to 200 nm.

14. The semiconductor device according to claim 8, wherein a thickness of the gate insulating film is greater than or equal to 5 nm and less than or equal to 400 nm.

\* \* \* \* \*